US009773086B1

(12) United States Patent
Liu et al.

(10) Patent No.: US 9,773,086 B1
(45) Date of Patent: Sep. 26, 2017

(54) METHODS, SYSTEMS, AND ARTICLES OF MANUFACTURE FOR IMPLEMENTING COPLANAR WAVEGUIDE TRANSMISSION LINES IN ELECTRONIC DESIGNS

(71) Applicant: Cadence Design Systems, Inc., San Jose, CA (US)

(72) Inventors: Jian Liu, Dublin, CA (US); Yanrui Wu, Shanghai (CN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/791,132

(22) Filed: Jul. 2, 2015

(51) Int. Cl.
*G06F 17/50* (2006.01)

(52) U.S. Cl.
CPC .............. *G06F 17/5077* (2013.01)

(58) Field of Classification Search
CPC ..................................... G06F 17/50
USPC ............................................. 716/126
See application file for complete search history.

(56) References Cited

U.S. PATENT DOCUMENTS

2009/0153432 A1* 6/2009 Manasson ............... H01Q 3/24
343/876

OTHER PUBLICATIONS

M. Abdullah, "Analysis and Design of Coplanar Waveguide for High-Speed Pulse Propagation on Printed Circuit Board", Universiti Sains Malaysia, Sep. 2007.
N. Dib et al., "Theoretical Characterization of Coplanar Waveguide Transmission Lines and Discontinuities", Radiation Lab., University of Michigan, Nov. 1992.

* cited by examiner

*Primary Examiner* — Thuan Do
(74) *Attorney, Agent, or Firm* — Vista IP Law Group, LLP

(57) ABSTRACT

Disclosed are techniques for implementing coplanar waveguide transmission lines in an electronic design. These techniques identify one or more electrically conductive shapes and a plurality of edge segments thereof in an electronic design. A plurality of model trace segments may be constructed based in part or in whole upon a plurality of edge segments. One or more coupled line groups may be generated with the plurality of model trace segments and one or more actual trace segments for a model of the electronic design. Electrical analyses or simulations may be performed on the model to generate electrical analysis results. The electronic design may then be devised or revised based on extracted parameter values of the electrical analysis results.

21 Claims, 25 Drawing Sheets

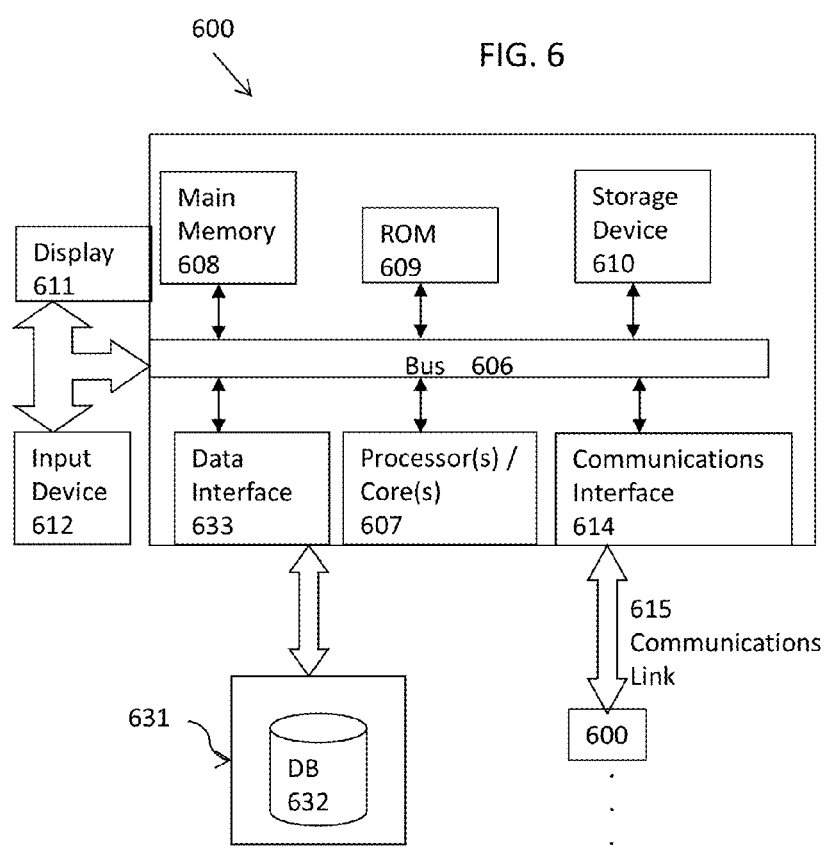

METHODS, SYSTEMS, AND ARTICLES OF MANUFACTURE FOR IMPLEMENTING COPLANAR WAVEGUIDE TRANSMISSION LINES IN ELECTRONIC DESIGNS

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Coplanar waveguide transmission lines have become more widely adopted in electronic designs to reduce the total number of layers in an electronic design as well as to lower the cost of manufacturing. With the ever increasing speed in interconnections and electronic designs, electromagnetic coupling (e.g., electromagnetic induction and/or radiation) among circuit components and thus degradation of signal integrity have become more crucial in modern electronics. As a result, detecting and modeling the coplanar waveguide transmission lines of an electronic design has also become more important.

Conventional approaches for detecting and modeling coplanar waveguide structures are based on geometries of the circuit components. These approaches identify the geometries of the circuit components and determine whether or not a circuit component constitutes a coplanar waveguide transmission line based on its geometries. These approaches then group the detected coplanar waveguide transmission lines into groups and perform electrical analyses for each group to extract the coupling effects.

Therefore, there exists a need for a method, system, and computer program product for implementing coplanar waveguide transmission lines.

SUMMARY

Disclosed are method(s), system(s), and article(s) of manufacture for implementing coplanar waveguide transmission lines in an electronic design in various embodiments. Some first embodiments are directed at a method for implementing coplanar waveguide transmission lines in an electronic design.

In these first embodiments, one or more electrically conductive shapes and a plurality of edge segments thereof in an electronic design may be identified. A plurality of model trace segments may be generated based in part or in whole upon a plurality of edge segments. At least one model trace segment of the plurality of model trace segments and one or more actual trace segments may be grouped into a coupled line group. Grouping model and actual traces into a coupled line group may be performed based in part or in whole upon one or more physics based criteria. The coupled line group may be added to a model of the electronic design. Electrical analyses or simulations may be performed on the model to generate electrical analysis results. The electronic design may then be devised or revised based on extracted parameter values of the electrical analysis results.

Some embodiments are directed at one or more hardware mechanisms that include and/or function in conjunction with at least one micro-processor as well as other related components or architectures of one or more computing systems and may be invoked to perform any of the methods, processes, or sub-processes disclosed herein. The hardware system may include one or more variants of a coupling detection mechanism, a shape processing mechanism, a model trace mechanism, a model trace marking mechanism, a coupled trace grouping mechanism, and/or one or more analysis or simulation mechanisms in some embodiments.

Each of these mechanisms may include or function in tandem with electrical circuitry and one or more microprocessors each having one or more processor cores to perform its intended functions. The hardware system may further include one or more forms of non-transitory machine-readable storage media or persistent storage devices to temporarily or persistently store various types of data or information, various design rules, various libraries, selected and selectable targets, or any other suitable information or data, etc. A mechanism is initialized in a computing system so that the software portion of the mechanism is stored in memory (e.g., random access memory) to be executed by one or more processors or processor cores off the computing system to perform at least a part of the functionality of the mechanism. Some illustrative modules or components of the hardware system may be found in the System Architecture Overview section below.

Some embodiments are directed at an article of manufacture that includes a non-transitory machine-accessible storage medium having stored thereupon a sequence of instructions which, when executed by at least one micro-processor or at least one processor core, causes the at least one micro-processor or the at least one processor core to perform any of the methods, processes, or sub-processes disclosed herein. Some illustrative forms of the non-transitory machine-readable storage media may also be found in the System Architecture Overview section below.

More details of various aspects of the methods, systems, or articles of manufacture for implementing coplanar waveguide transmission lines in an electronic design are described below with reference to FIGS. 1-6.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIG. 6 illustrates a computerized system on which a method for implementing coplanar waveguide transmission lines in electronic designs may be implemented.

DETAILED DESCRIPTION

Figure 1A:
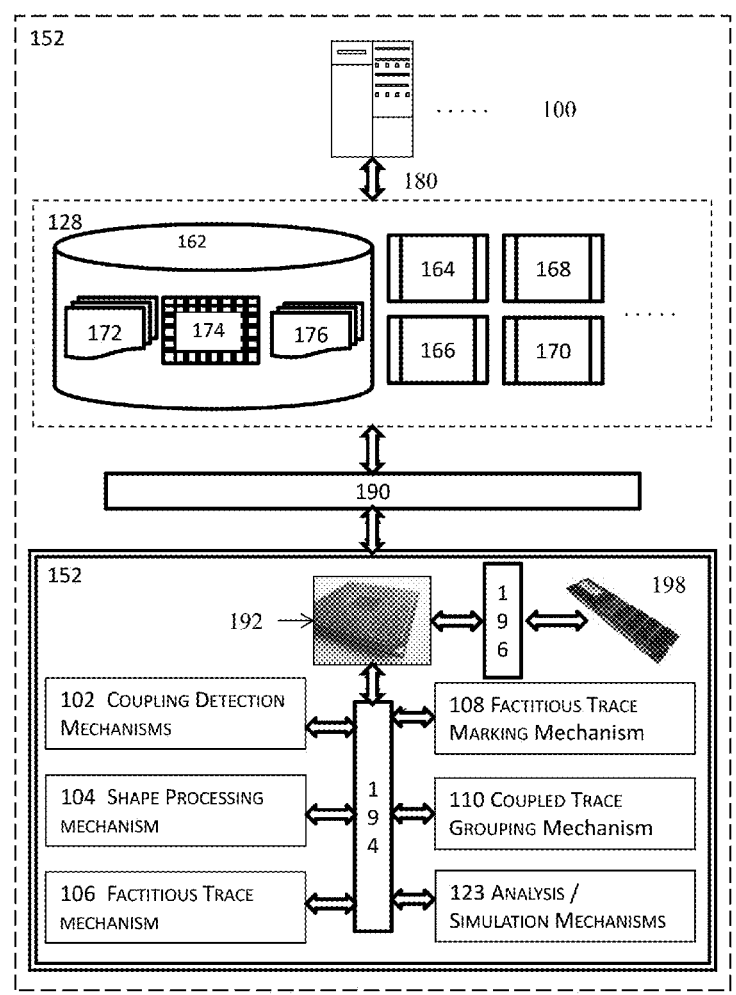
FIG. 1A illustrates a high level schematic block diagrams for implementing coplanar waveguide transmission lines in electronic designs in one or more embodiments.

Various embodiments are directed to a method, system, and computer program product for verifying connectivity of an electronic design. Other objects, features, and advantages of the invention are described in the detailed description, figures, and claims.

Unlike the geometry-based conventional approaches that detect coplanar waveguide structures by examining the geometries of electronic circuit components, the coplanar waveguide detection and modeling techniques described herein are physics based. These techniques described herein convert or transform the edges of metal shapes into model traces or generate model traces based in part or in whole upon the metal shapes or the edges thereof and construct coupled line groups with actual traces in the electronic design. Therefore, the disclosure may include various embodiments describing that edges of metal shapes are transformed into model traces although the use of the word transform or transformation does not preclude the generation of a model trace anew (e.g., by determining the dimensions and location of a model trace from scratch) by referencing a corresponding electrically conductive shape, an edge of the electrically conductive shape, or a segment thereof for the location of the newly generated model trace in a model for analyses and/or simulations.

It shall be noted that the terms convert, transform, generate, derive, and construct as well as other similar terms may be used interchangeably within the context of model trace generation in this disclosure to refer to deriving, constructing, or generating a model trace from an electrically conductive shape, an edge of the electrically conductive shape, or a segment thereof although various sections of this disclosure may refer to "an edge" for the sole purpose of simplicity and ease of description.

In deriving or constructing a model trace, an edge of an electrically conductive shape for which the model trace is determined or the data associated with the edge is referenced. This referenced edge or data may be used to determine where the corresponding model trace may be placed in a model for further analyses. One or more geometric characteristics (e.g., the width, length, end points, and/or thickness) may be determined for the model trace. A model trace with these one or more geometric characteristics may then be placed at a location in a model where an edge of the model trace is aligned with the referenced edge of the electrically conductive shape if both the model trace and the referenced edge are to co-exist in the model.

The location may be further constrained such that the electrically conductive shape partially or fully accommodates the model trace. Certain model traces that are parallel with some corresponding actual traces and exhibit certain coupling effects (e.g., the coupling coefficient is greater than or equal to a predefined value) may also be grouped into the respective coupled transmission line groups. An analysis engine or simulator then performs an electrical analysis with both the actual traces and model traces to capture the coupling effects between the actual traces and various shapes.

The electrical analysis results may further be used to perform other analyses such as signal integrity analyses. In some embodiments, the model traces may also be used to determine whether an actual trace is shielded by metal shapes. In some embodiments, the techniques described herein transform all the edges of metal shapes on a layer of an electronic design into model edges and perform electrical analyses with all the edges. Based on the coupling criteria, certain model edges may be grouped into one or more transmission line coupled groups. The coupling effects among traces may thus be determined. One advantage of these techniques is that a coupling criteria no longer needs to be geometry based (e.g., the spacing between two immediately neighboring traces needs to be of some minimum value). Rather, these physics-based techniques may use the actual values of interest as a coupling criterion. For example, a designer no longer needs to determine and specify the minimum spacing values or other between adjacent wires while not knowing whether such a geometry-based criterion actually meet various electrical requirements (e.g., requirements for cross-talk, intersymbol interference, etc.) Rather, the designer may directly specify, for example, the coupling strength or the cross-talk is not to exceed certain values.

One advantage of these techniques described herein is that with the conversion or transformation of shape edges into the well-solved for traces (model traces) or the construction or generation of the well-solved for traces (model traces) based on the corresponding shape edges, the coupling between the metal shapes as well as the coupling and interactions between the metal shapes and actual traces, if any, are accounted for in the electrical analyses. These techniques may then construct the transmission line coupled groups by aggregating the model traces whose interactions with other traces (model and/or actual traces) are sufficiently strong for further determining various electrical characteristics of interest. That is, unlike conventional approaches that form the transmission line coupled groups based on geometries without knowing whether or not the interactions among certain shapes and/or traces are sufficiently strong to desire further consideration or evaluation, the techniques described herein may filter out certain traces that do not exhibit sufficiently strong interactions with other components and form the transmission line coupled groups with the traces (model and/or actual traces) that may potentially cause issues or concerns.

Another advantage is that these techniques described herein are physics-based, rather than geometry-based as conventional approaches are and thus allow the specification of the electrical and/or physical property values that an electronic design are to observe. That is, the physics-based techniques not provide more pertinent and accurate criteria to decide whether or not certain traces or shapes are to be considered, rather than some geometry-based criteria (e.g., a spacing value between two traces) that may lead to overly optimistic results (e.g., when a certain trace should be but is not considered and grouped into a transmission line coupled group) or overly pessimistic results (e.g., when a certain trace should not be but is considered and grouped into a transmission line coupled group simply because of a geometry-based criterion is satisfied).

Therefore, the physics-based techniques not only conserve computation resources but also provide more accurate results by accounting for pertinent metal shapes in the form of model traces as well as the actual traces, if any, in an electronic design. A typical example of the application of the techniques described herein is the more accurate extraction of, for example, coupling coefficients and LC matrix for an electronic design while performing requisite computations by forming transmission line coupled groups with the traces of interest.

A further advantage of these techniques is that both the shapes (in the form of model traces) as well as the well-solved for actual traces, if any, are accounted for and then screened or filtered via electrical analysis results while conserving the computational resources. Due to the fact that well-solved for traces often include simply geometric configurations and require more complex modeling techniques such as finite difference or finite element methods, the transformation or conversion of shapes into model traces or the construction of model trances based on the corresponding shapes or edges thereof actually and optionally decompose a model trace into multiple, smaller model trace segments, these techniques nevertheless enjoy the benefit of well-solved for traces without expensing huge computational resources to obtain accurate results.

The electrical analysis results may further be used to perform other analyses such as signal integrity analyses. In some embodiments, the model traces may also be used to determine whether an actual trace is shielded by metal shapes. In some embodiments, the techniques described herein transform all the edges of metal shapes on a layer of an electronic design into model edges and perform electrical analyses with all the edges. Based on the coupling criteria, certain model edges may be grouped into one or more transmission line coupled groups.

The coupling effects among traces may thus be determined. One advantage of these techniques is that a coupling criteria no longer needs to be geometry based (e.g., the spacing between two immediately neighboring traces needs to be of some minimum value). Rather, these physics-based techniques may use the actual values of interest as a coupling criterion. For example, a designer no longer needs to determine and specify the minimum spacing values or other between adjacent wires while not knowing whether such a geometry-based criterion actually meet various electrical requirements (e.g., requirements for cross-talk, intersymbol interference, etc.) Rather, the designer may directly specify, for example, the coupling strength or the cross-talk is not to exceed certain values.

Various embodiments of the methods, systems, and articles of manufacture will now be described in detail with reference to the drawings, which are provided as illustrative examples of the invention so as to enable those skilled in the art to practice the invention. Notably, the figures and the examples below are not meant to limit the scope of various embodiments, unless otherwise specifically described in particular embodiment(s) or recited in the claim(s).

Where certain elements of embodiments may be partially or fully implemented using known components (or methods or processes), portions of such known components (or methods or processes) that are necessary for an understanding of the present invention will be described, and the detailed descriptions of other portions of such known components (or methods or processes) will be omitted for ease of explanation and to not obscure embodiments of the invention. Further, embodiments encompass present and future known equivalents to the components referred to herein by way of illustration. More details about various processes or modules to implement various embodiments are further described below with reference to FIGS. 1-6.

FIG. 1A illustrates a high level schematic block diagrams for implementing coplanar waveguide transmission lines in electronic designs in one or more embodiments. More specifically, FIG. 1A illustrates an illustrative high level schematic block diagrams for implementing coplanar waveguide transmission lines in electronic designs and may comprise one or more computing systems 100, such as a general purpose computer described in the System Architecture Overview section to implement one or more special proposes.

In some embodiments, the one or more computing systems 100 may invoke various system resources such as the processor(s) or processor core(s), memory, disks, etc. The one or more computing systems 100 may also initiate or interact with other computing systems to access, via a computer bus architecture (e.g., a system bus, a control bus, a data bus, or any combinations thereof), various resources 128 that may comprise a floorplanner, a global routing engine, and/or a detail routing engine 164, a layout editor 166, a design rule checker 168, a verification engine 170, etc.

The one or more computing systems 100 may further write to and read from a local or remote non-transitory computer accessible storage 162 that stores thereupon data or information such as, but not limited to, one or more databases (174) such as schematic design database(s) or physical design database(s), electronic circuit design specification database(s), various statistics, various data, rule decks, various design rules, constraints, etc. (172), or other information or data (176) that may be used to facilitate the performance of various functions to achieve the intended purposes.

In some embodiments, the one or more computing systems 100 may include or, either directly or indirectly through the various resources 128, invoke a set of mechanisms 152 including hardware mechanisms and software modules or combinations of one or more hardware mechanisms and one or more software modules that may comprises a coupling detection mechanism 102 to detect coupled traces, electrically conductive shapes, or any combinations thereof and a shape processing mechanism 104 to approximate curved shapes with linear elements and/or to extract one or more properties (e.g., geometric, physical, and/or electrical properties) of a shape. The coupling detection mechanism 102 may also identify one or more constraints, one or more requirements, one or more parameters, or any combinations thereof for a coupled transmission line or a coupled transmission line group.

The set of mechanisms 152 may further optionally include a model trace mechanism 106 to determine the location, end(s), width, thickness, and/or length of a model trace, model trace marking mechanism 108 to identify model traces with textual emphasis, graphical emphasis, or both textual and graphical emphasis in a user interface, a coupled trace grouping mechanism 110 to classify and group model and actual traces into one or more coupled line groups, and one or more analysis or simulation mechanisms 112 to perform various analyses or simulations for electronic designs having one or more coupled line groups.

In some embodiments, the computing system 100 may include the various resources 128 such that these various resources may be invoked from within the computing system via a computer bus 180 (e.g., a data bus interfacing a microprocessor 192 and the non-transitory computer accessible storage medium 198 or a system bus 190 between a microprocessor 192 and one or more engines in the various resources 128). In some other embodiments, some or all of these various resources may be located remotely from the computing system 100 such that the computing system may access the some or all of these resources via a computer bus 180 and one or more network components.

The computing system may also include one or more mechanisms in the set of mechanisms 152. One or more mechanisms in the set 152 may include or at least function in tandem with a microprocessor 192 via a computer bus 194 in some embodiments. In these embodiments, a single microprocessor 192 may be included in and thus shared among more than one mechanism even when the computing system 100 includes only one microprocessor 192. A microprocessor 192 may further access some non-transitory memory 198 (e.g., random access memory or RAM) via a system bus 196 to read and/or write data during the microprocessor's execution of processes.

Figure 1B:
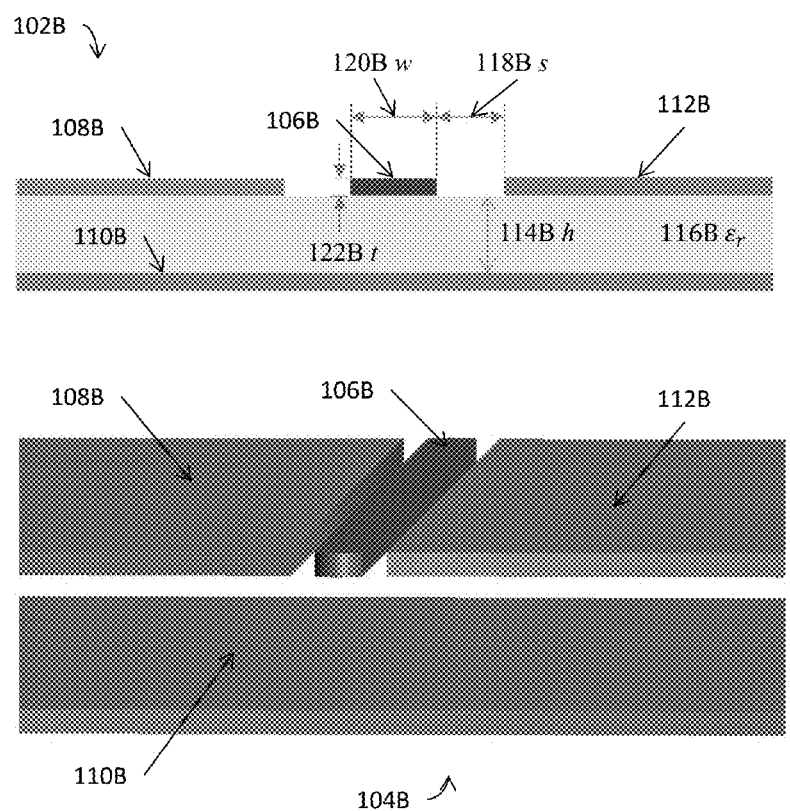
FIG. 1B illustrates an example of a portion of an electronic design including a coplanar waveguide.

FIG. 1B illustrates an example of a portion of a simplified electronic design including a coplanar waveguide. More specifically, the portion of the simplified electronic design in FIG. 1B includes a coplanar waveguide structure where 102B represents a two-dimensional (2D) cross-sectional view of a multi-layer stack further including electrically conductive (e.g., metal) shapes 108B and 112B and a trace 106B that are separated from the ground plane 110B with a dielectric medium having permittivity "$\in_r$" (116B) and situated at a distance "h" (114B) from the bottom surface of the metal shapes 108B and 112B and trace 106B. In some embodiments, the distance 114B is determined to be much greater than the spacing value 118B.

The cross-section of trace 106B has a width value "w" (120B) and a thickness value "t" (122B) and is situated at a spacing value s (118B) from the metal shape 112B and at the same spacing value from the metal shape 108B. The edges of the ground plane 110B may or may not be transformed into model traces. In some embodiments, whether or not one or more edges of a ground plane are transformed into one or more corresponding model traces may be determined based in part or in whole upon the coupling effects, coupling coefficient, or the permittivity (e.g., 116B) of the dielectric medium separating the ground plane and an immediately neighboring metal layer and the spacing between the ground plane and the immediately neighboring metal layer (e.g., 114B).

The perspective view 104B of FIG. 1B illustrates the corresponding pseudo-three-dimensional (pseudo-3D) or two-and-a-half dimensional (2.5D) view of the coplanar waveguide structure of 102B. The waveguide structure 102B is coplanar in that trace 106B and metal shapes 108B and 112B are situated on the same plane. In some embodiments, a trace (e.g., 106B) may include a metal or other electrically conductive conductor of various cross-sectional profiles. A profile of a trace may have a constant profile having a fixed width (e.g., 120B) and a fixed thickness (e.g., 122B) in some embodiments. In some other embodiments, a trace may have a variable profile having a variable width and a constant thickness, which may be fabricated with, for example, a deposition or plating process.

In some embodiments, traces may be generally categorized into actual traces and model traces. An actual trace includes an actual design of an interconnect, a wire, or a PCB (printed circuit board) trace. A model trace is not intended or designed to be an interconnect, a wire, or a PCB trace in an electronic design. Rather, a model trace is created with appropriate dimensions for an electrically conductive shape (e.g., a metal shape) by some of the techniques described herein and is placed at a specific location corresponding to the electrically conductive shape in a model for analyzing or simulating the electronic design in some embodiments. In these embodiments, a model trace is not included in the design data of the electronic design under analysis or simulation and will not be manufactured as a part of the electronic design. Actual traces may further be classified into types such as power traces, ground traces, and signal traces.

After identifying the electronic design or a portion thereof, one or more edges of electrically conductive shapes (e.g., the edges of shapes 108B and 112B sandwiching trace 106B) may be transformed into model traces. In some embodiments, all of the edges of all electrically conductive shapes are transformed into corresponding traces. In some other embodiments, only the edges of some but not all of the electrically conductive shapes are transformed into model traces. A model trace may inherit all the physical and/or electrical characteristics but not all of the geometric characteristics (e.g., length, width, thickness, etc.) of the electrically conductive shape from which the model edge is derived.

It shall be noted that although the term "trace" often refers to a electrically conductive wire or foil conducting electricity on a printed circuit board (PCB), these techniques described herein may also be applied to other types of electronic designs, and that the use of the term "trace" is not intended to limit the scope of invention. In addition, the term "metal shape" collectively refers to an electrically conductive shape that may be made of the material including, metal, polysilicon, or other electrically conductive materials.

Figure 1C:
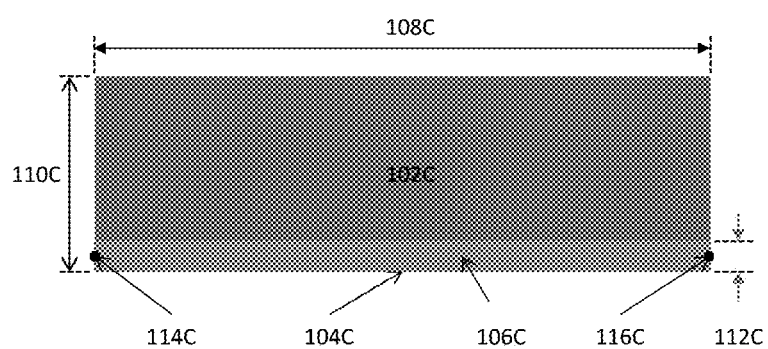
FIG. 1C illustrates a simplified example of a metal shape and a model trace associated with the metal shape in one or more embodiments.

FIG. 1C illustrates a simplified example of a metal shape and a model trace associated with the metal shape in one or more embodiments. More specifically, FIG. 1C illustrates the top view of the metal shape that has a thickness value w in the direction perpendicular to the plane defined by shape 102C. In transforming the bottom edge 104C into the corresponding model trace 106C, some embodiments may identify the length 108C ("l") and the height 110C ("h") of the metal shape. The length of shape 102C may be determined as the length of the model trace 106C. The thickness of the trace 106C (into the plane defined by the two-dimensional shape 102C) may be determined to be the thickness of the layer (e.g., signal layer, ground layer, power layer, etc.) where the metal shape resides. In some embodiments, the height 110C of the shape 102C may be determined to be the width 112C of the model trace 106C if the height 110C of the shape is determined not to exceed a predetermined threshold value (e.g., 2 mm).

In some of these embodiments where the height 110C of the shape 102C exceeds the predetermined threshold value, the predetermined threshold is assigned to the width 112C of the model trace 106C. The model trace 106C may be placed in the electronic design by aligning the bottom edge of the model trace 106C with the bottom edge 104C of the metal shape 102C to reflect the skin effect of alternating current (AC) flows and to more precisely capture the interactions between the model trace 106C and one or more other metal shapes and/or traces in some embodiments. Two nodes, 114C and 116C, may be optionally added to the model trace 106C to identify the end points of the model trace 106C in some embodiments.

As described immediately above, the width of a model trace may be bounded by a pre-determined upper bound in some embodiments. In an example of a printed circuit board (PCB), the pre-determined upper bound for a model trace width may include a value of, for example, a few millimeters (e.g., 1 mm, 5 mm, etc.) In some embodiments where a metal shape includes a curved edge, the techniques may first sub-divide the curved edge into a plurality of line segments and transform each line segment into a corresponding model trace. In addition, a model trace or an actual trace may also be sub-divided into a plurality of trace segments. For example, a transmission line coupled group may include traces of the same width for more expedient analyses in some embodiments. In some of these embodiments, a longer trace may thus be sub-divided into multiple shorter trace segments such that at least one of these short trace segments may be properly grouped into a transmission line coupled group.

Figure 1D:
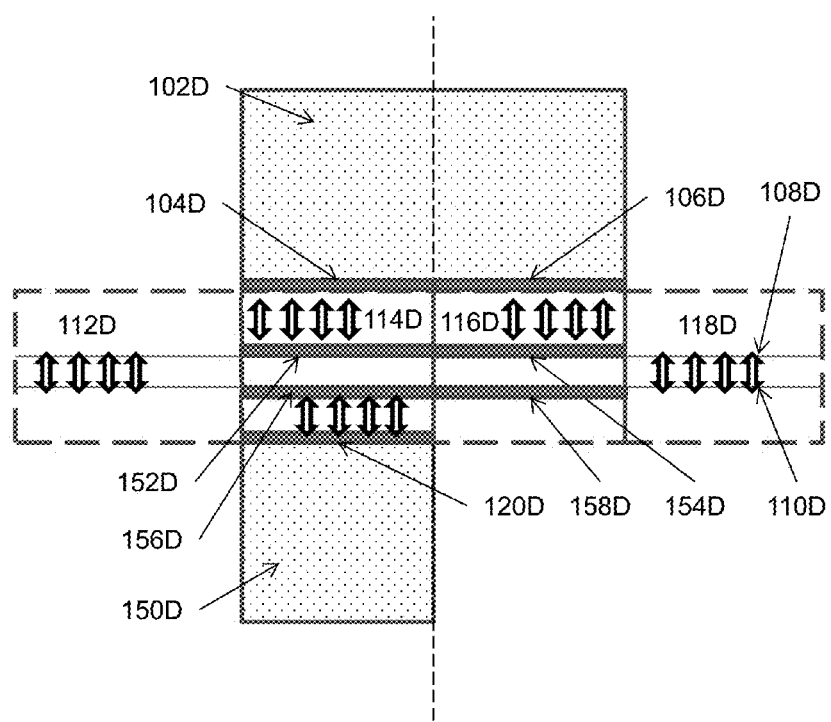
FIG. 1D illustrates a simplified planar view of a portion of an electronic design including actual traces and metal shapes in one or more embodiments.

FIG. 1D illustrates a simplified planar view of a portion of an electronic design including actual traces and metal shapes in one or more embodiments. More specifically, FIG. 1D illustrates a simplified planar view of a portion of an electronic design including actual traces 108D and 110D and metal shapes 102D and 150D. The bottom edges (in the orientation of FIG. 1D) may be initially transformed into a single model trace in some embodiments. This single model trace may further be partitioned into two shorter model trace segments 104D and 106D.

In some other embodiments, the bottom edge of shape 102D may be transformed into model traces 104D and 106D such that the model trace 104D may be grouped, if needed, with the actual trace segment 152D of the actual trace 108D. Therefore, the transmission line coupled group 112D includes two actual trace segments of the same length; the transmission line coupled group 114D includes two model trace segments (104D and 120D) and two actual trace segments (152D and 156D) of the same length; the transmission line coupled group 116D includes one model trace segment 106D and two actual trace segments 154D (from actual trace 308) and 158D of the same length; and the transmission line coupled group 118D includes two actual trace segments of the same length from actual traces 108D and 110D.

Figure 1E:
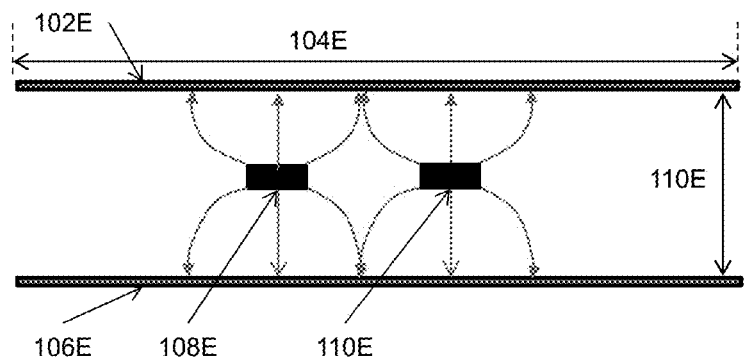
FIG. 1E illustrates a simplified schematic representation of a coupled line group in one or more embodiments.

FIG. 1E illustrates a simplified schematic representation of a coupled line group in one or more embodiments. In this simplified schematic representation, 108E and 110E represent the cross-sections of two traces that are sandwiched between two reference planes—the top reference plane 102E and the bottom reference plane 106E—spaced apart at a distance of 110E. In some embodiments, whether or not traces (whether actual, model, or a combination of actual and model traces) may be grouped into a coupled line group may be determined based in part or in whole upon one or more criteria.

The one or more criteria may include a first requirement that traces belonging to the same coupled line group have the same top and/or bottom reference planes (e.g., 102E and/or 106E). The one or more criteria may include the coupling ratio or coupling coefficient between traces or trace segments thereof in some embodiments. In these embodiments, the one or more criteria include at least one physics-based criterion, rather than any geometry-based criteria. For example, traces or segments thereof may be grouped into a coupled line group if the coupling ratio or coupling coefficient exceeds a predetermined threshold such as 2%.

In determining the coupling ratio or coupling coefficient, the inductances or capacitances may be extracted by using, for example, the two-dimensional boundary element method or the two-dimensional method of moments. During analyses or simulations of an electronic design, a user may explicitly specify the physics-based coupling coefficient value, rather than implicitly specifying any geometry-based requirements including, for example, a spacing value between adjacent lines below which two adjacent conductors are considered as coupled conductors. Another example of a physics-based criterion comprises, for example, the permissible or desirable threshold for crosstalk (e.g., an amount of jitter as measured by the deviation of a signal's edge from its expected location).

During analyses or simulations, a user may explicitly specify the permissible or desirable threshold for crosstalk, rather than implicitly specifying any geometry-based criteria or constraints and hoping that such geometry-based criteria or constraints would produce desirable electrical behavior. As another example of a physics-based criterion for coupled line grouping, traces or trace segments may be grouped into the same coupled line group if the rise time associated with the traces or trace segments exceeds a certain predetermined value such as 100 pico-seconds. The one or more criteria may also optionally include the lengths, traces or segments thereof, or rise time in some embodiments.

For example, traces or trace segments may be grouped into the same coupled line group if the lengths of the traces or trace segments exceed a certain predetermined length value. In addition or in the alternative, traces (e.g., 108E and 110E) may be grouped into one coupled line group when these two traces are situated between the same reference planes (e.g., 102E and 106E) and are positioned relative to each other within a predetermined permissible deviation from true parallelism as designed.

In some of these embodiments, the permissible deviation is 20 degrees. In these embodiments, two traces or segments thereof sandwiched between the same pair of reference planes may be grouped into a coupled line group if an angle between these two traces or trace segments thereof is less than or equal to the permissible deviation. With some of the techniques provided herein, if two electrical conductors meet the one or more physics-based criteria, these two electrical conductors may be grouped into a coupled line group which will be analyzed together as a group, rather than being analyzed individually.

Figure 1F:
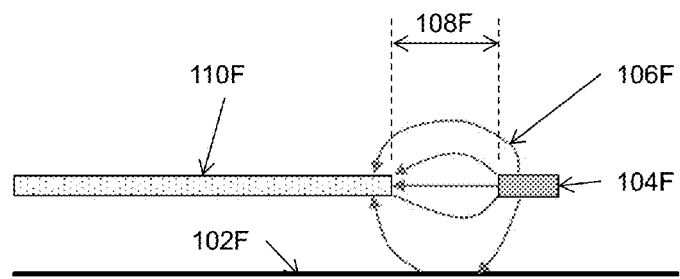
FIG. 1F illustrates a simplified schematic representation of a coplanar waveguide transmission line in one or more embodiments.

FIG. 1F illustrates a simplified schematic representation of a coplanar waveguide transmission line in one or more embodiments. The simplified schematic representation in FIG. 1F includes a reference plane 102F and an actual trace 104F. The actual trace 104F is coplanar with an electrically conductive shape 110F with a spacing value of 108F. In some embodiments, various techniques may also consider the spacing value (e.g., 108F) between two neighboring conductors as a control parameter because the spacing value may affect the coupling capacitance between two adjacent conductors and hence the rise time.

In these embodiments, the spacing between a coplanar waveguide transmission line (e.g., trace 104F) and an immediately neighboring model trace may also be an objective or a control parameter for optimization in devising the portion of the electronic design. Reference numeral 106F illustrates the electromagnetic field lines between shape 110F and the actual trace 104F. In some embodiments, the actual trace 104F is determined to be a coplanar waveguide transmission line if the length of the actual trace 104F is at least one-and-a-half times (1.5×) of the width of the actual trace 104F.

In some embodiments, the actual trace 104F is determined to be a coplanar waveguide transmission line if the spacing value 108F is less than a predetermined multiple of the width of the trace. In some of these embodiments, the predetermined multiple is four times the width of the trace. In the alternative, the predetermined multiple may be relaxed to two times the width of the trace. In some embodiments, the spacing (108F) between a trace (e.g., 104F) and a neighboring shape (e.g., 108F) may be constrained by an maximum separation spacing value such as ten times of the width of the trace of interest.

Figure 2A:
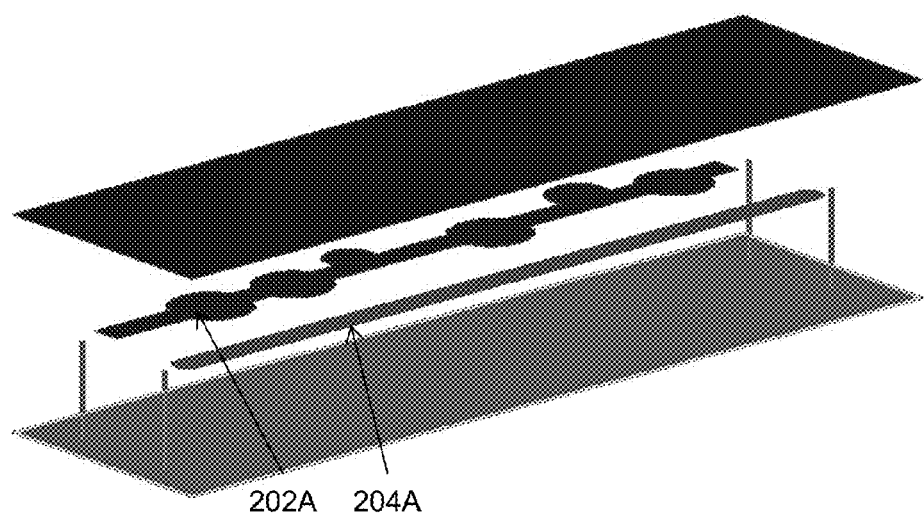
FIG. 2A illustrates a perspective view of a simplified representation of coplanar waveguide transmission lines in one or more embodiments.
Figure 2B:
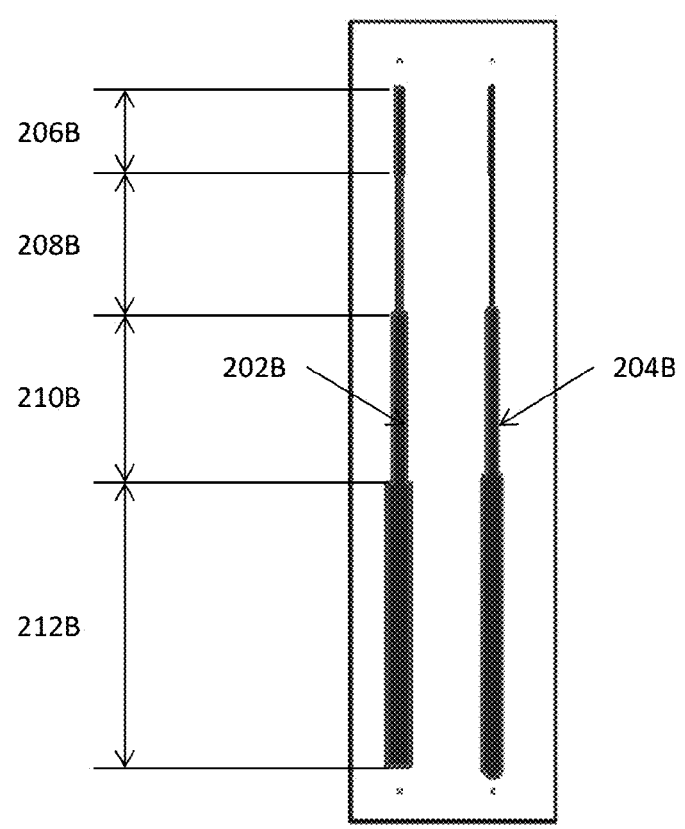
FIG. 2B illustrates a planar view of a simplified representation of coplanar waveguide transmission lines in one or more embodiments.

FIG. 2A illustrates a perspective view of a simplified representation of coplanar waveguide transmission lines in one or more embodiments. FIG. 2A illustrates that various techniques described herein not only apply to traces and shapes of a constant width (e.g., shape or trace 204A) but also shape or traces of variable widths (e.g., trace or shape 202A). FIG. 2B illustrates a planar view of a simplified representation of coplanar waveguide transmission lines in one or more embodiments.

FIG. 2B also illustrates that various techniques described herein apply to traces and shapes of variable widths. In this example, both traces or shapes 202B and 204B have variable widths along the length direction. In some embodiments, 202B (or 204B) may be approximated with a single trace or shape having a uniform width (e.g., the average width or a weighted average width based on the respective length of each segment). In some other embodiments, 204B (or 202B) may be decomposed into multiple segments, each having a uniform width. In these embodiments, the coupled line groups may be determined for each pair of opposing edges of 202B and 204B. In other embodiments, one of the two shapes or traces 202B and 204B may be approximated with a single shape or trace having a uniform width, and the other may be decomposed into a plurality of segments for the determination of coupled line groups.

Figure 2C:
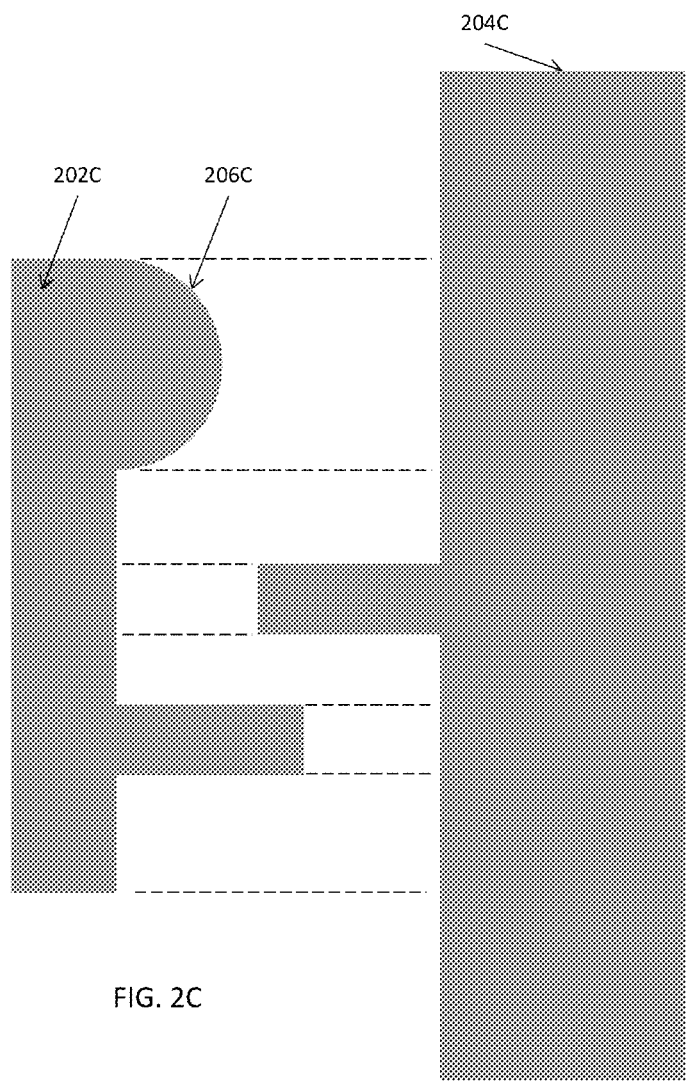
FIGS. 2C-E illustrate an example for the determination of coupled line groups for a portion of an electronic design including multiple electrically conductive shapes in one or more embodiments.
Figure 2D:
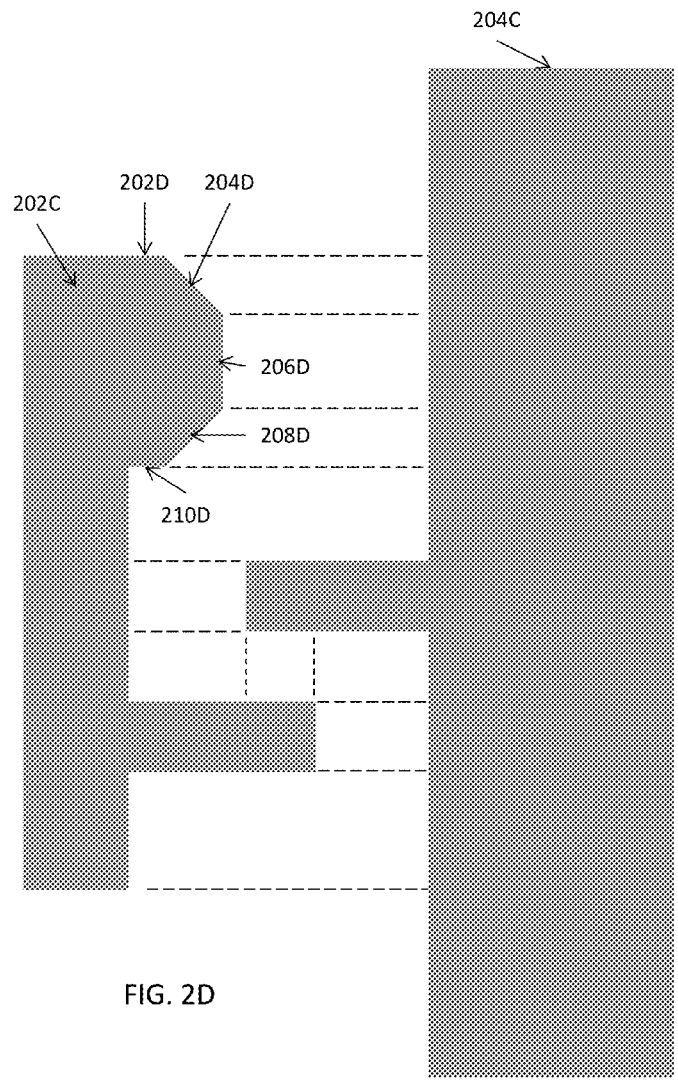
Figure 2E:
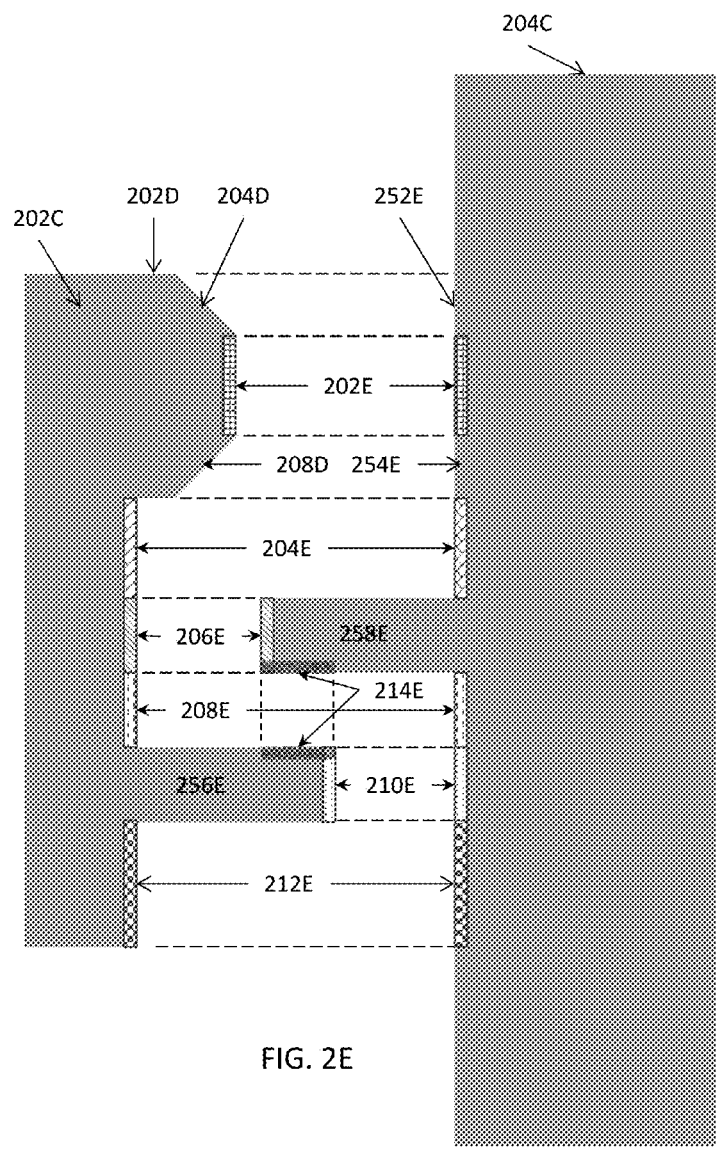

FIGS. 2C-E illustrate an example for the determination of coupled line groups for a portion of an electronic design including multiple electrically conductive shapes in one or more embodiments. More specifically, FIG. 2C illustrates a portion of a simplified electronic design including two irregular metal shapes, two traces, or a metal shape and an actual trace that are referred to as two electrical conductors 202C and 204C. FIG. 2C is provided to illustrate an example for the determination of coupled line groups. It is assumed that each dimension including the length and width of each segment of the two irregular conductors exceeds the maximum permissible model trace width. As previously described, a model trace transformed from an edge of an electrical conductor is the larger of the width of the electrical conductor or the maximum permissible model trace width. Therefore, a model trace transformed from any edge of these two electrical conductors 202C and 204C has a width of the maximum permissible model trace width.

FIG. 2D illustrates an example of the determination and construction of coupled line groups in for the portion of the simplified electronic design illustrated in FIG. 2C. In this example, the curved boundary segment 206C of the electrical conductor 202C may be approximated by a plurality of linear boundary segments. In this example, the curved boundary segment 206C is approximated by the linear boundary segments 202D, 204D, 206D, 208D, and 210D. It is further assumed that each pair of opposing edges satisfies the coupling requirements as described above with reference to FIG. 1F. The number of linear boundary segments used to approximate a curved boundary may be determined based in part or in whole on the required or desired level of accuracy, the relation between the lengths of the linear boundary segments and their widths, and/or the relation between the lengths of the linear boundary segments and the spacing values to a neighboring trace in some embodiments.

FIG. 2E illustrates the coupled line groups determined by using some of the techniques described herein in some embodiments. It is assumed that the angle between boundary segment 204D and its opposing boundary segment 252E along the left boundary of the electrical conductor 204C exceeds the maximum deviation from parallelism. Therefore, boundary segment 204D and boundary segment 252E are not determined to belong to a coupled line group. Similarly, boundary segments 208D and 254E are also determined not to belong to a coupled line group because these two boundary segments are not parallel with respect to each other within a maximum permissible deviation from parallelism.

The vertical boundary segment 206D and its opposing boundary segment along the left boundary of the electrical conductor 204C and may thus be classified into a coupled line group 202E. These two boundary segments are also identified with graphical emphasis in FIG. 2E as such. Coupled line groups 204E, 206E, 208E, 210E, and 212E may also be similarly determined, assuming all boundary segments respectively included in each coupled line group satisfy the coupling requirements as described above with reference to FIG. 1F. The interdigitated portion 256E of the electrical conductor 202C and portion 258E of the electrical conductor 204C may also be electromagnetically coupled to each other and may thus be classified into the coupled line group 214E. The corresponding boundary segments in these two interdigitated portions 256E and 258E are also graphically emphasized as illustrated in FIG. 2E.

Figure 3A:
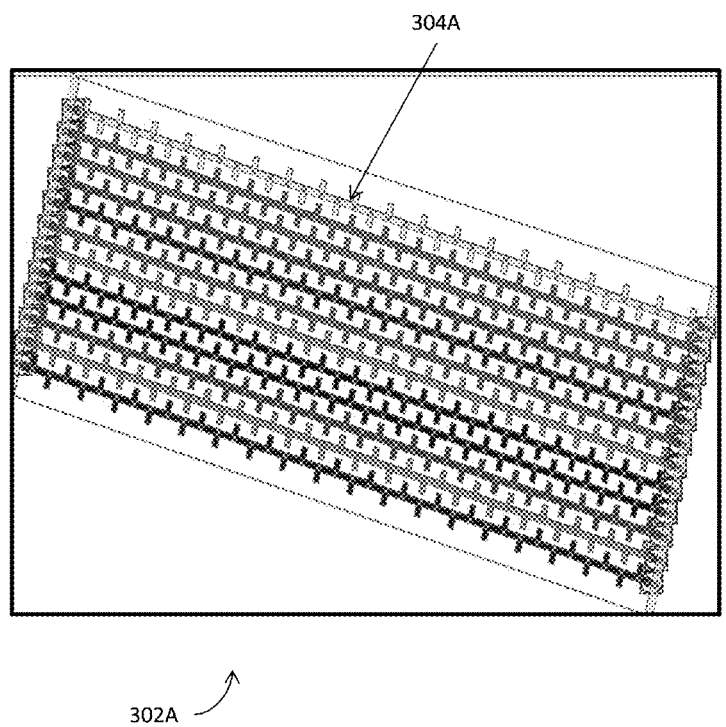
FIG. 3A illustrates a perspective view of another simplified representation of coplanar waveguide transmission lines in one or more embodiments.

FIG. 3A illustrates a perspective view of another simplified representation of coplanar waveguide transmission lines in one or more embodiments. FIG. 3A illustrates that various techniques described herein may also apply to traces or shapes having complex geometries such as interdigitating shapes 304A in view 302A of FIG. 3A.

Figure 3B:
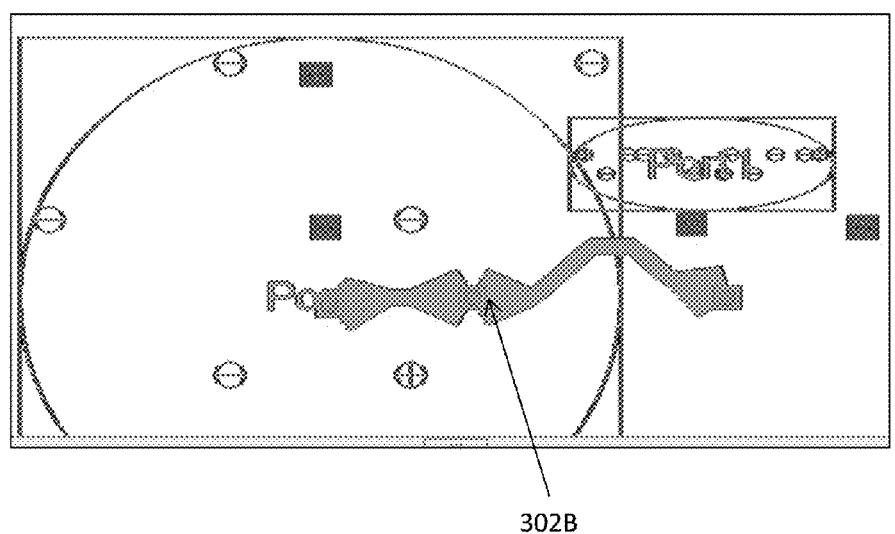
FIG. 3B illustrates a perspective view of another simplified representation of a coplanar waveguide transmission line having an irregular shape in one or more embodiments.

FIG. 3B illustrates a perspective view of another simplified representation of a coplanar waveguide transmission line having an irregular shape in one or more embodiments. In some embodiments, the irregular shape of an electrically conductive shape 302B may be approximated by a plurality of smaller linear segments. The plurality of smaller linear segments may be individually considered to determine whether these linear segments for coupled line groups with neighboring traces or shapes. For example, a linear segment of the irregular shape may be determined to form a coupled line group with a neighboring shape or trace if the angle between the linear segment and the opposing edge of the neighboring shape or trace is smaller than or equal to a predetermined threshold angle (e.g., 20 degrees).

Figure 3C:
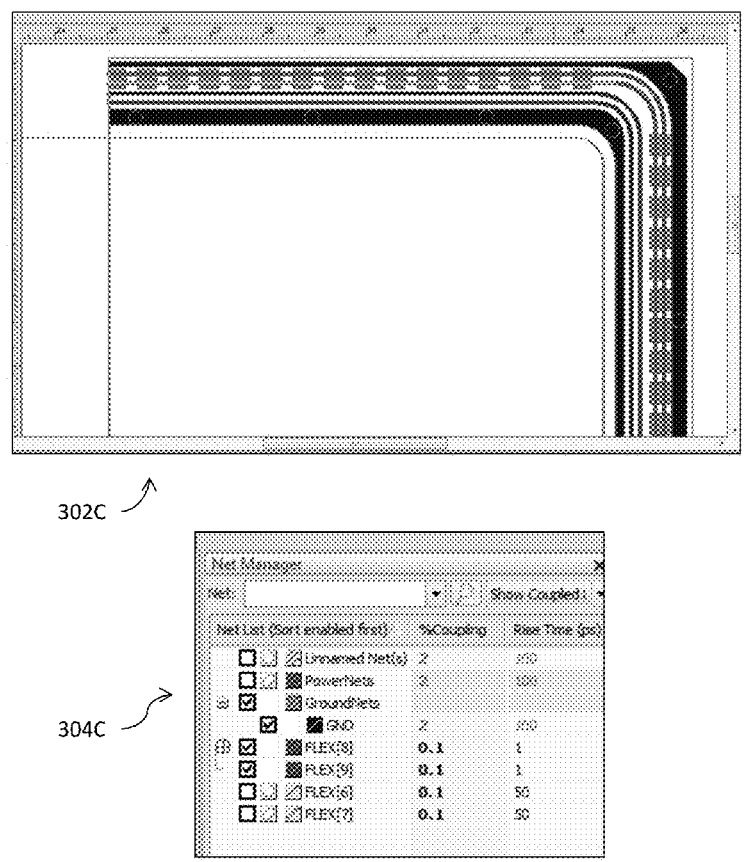
FIG. 3C illustrates a portion of a user interface showing coupled line groups in one or more embodiments.

FIG. 3C illustrates a portion of a user interface showing coupled line groups in one or more embodiments. 302C illustrates multiple coupled line groups that may be annotated or emphasized with textual emphasis, graphical emphasis, or both textual and graphical emphasis. For example, each coupled line group may be represented in a different color, line-type, etc. The coupled actual trace segments and model trace segments may be represented with markers either automatically or upon demand by the user in some embodiments. For example, a user may instruct the tool to show the coupled trace segments within one or more coupled line groups, and the tool will automatically represents the coupled trace segments in each of the one or more coupled line groups with graphical markers (e.g., with gray halos surrounding the coupled trace segments).

In addition or in the alternative, a net manager 304C may further provide more detailed information about the coupled line groups. For example, the net manager 304C may provide information including rise time (in pico-seconds), the coupling coefficient(s), the legends for coupled line groups, or any other pertinent or desired information. The net manager 304C may also provide a user interface for a user to show or hide one or more coupled line groups, and the graphical display window in 302C will automatically reflect the user's selection.

Figure 3D:
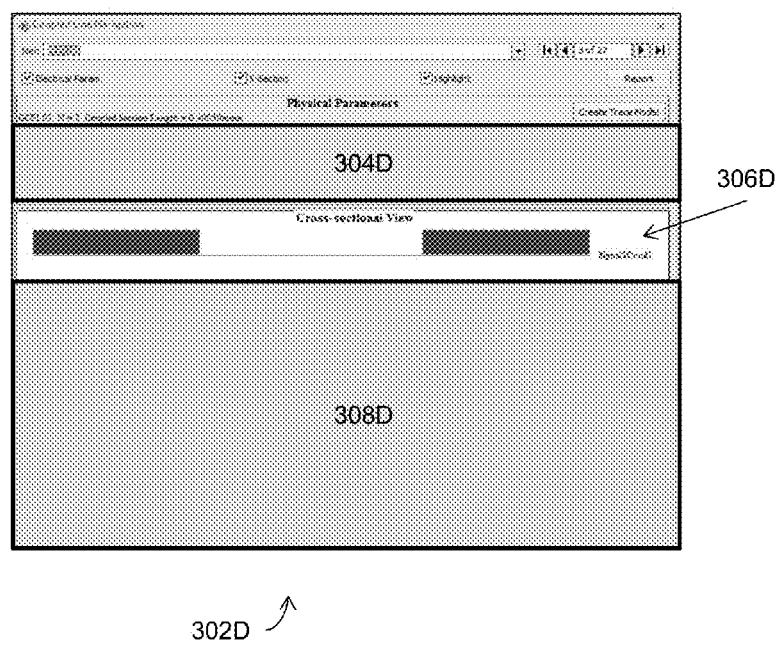
FIG. 3D illustrates a portion of a user interface providing various information and controls or handles for coplanar waveguide transmission lines in a coupled line group in one or more embodiments.

FIG. 3D illustrates a portion of a user interface providing various information and controls or handles for coplanar waveguide transmission lines in a coupled line group in one or more embodiments. In this example, the user interface 302D may include a cross-sectional view 306D of a coupled line group. The user interface 302D may further include a first display area 304D to provide information about the coupled line group whose cross-sectional view is illustrated in 302D. For example, the first display area 304D may provide information including the identification or name of actual and/or model traces, the identification or name of the layer to which the traces belong, the spacing between two immediately neighboring traces, the widths of traces, the thicknesses of traces, the lengths of traces, one or more physical parameters of traces, any other pertinent or desirable information, or any combinations thereof.

The user interface 302D may further include a second display area 308D that provides additional information including, for example, one or more electrical parameters (e.g., the capacitance matrix of the coupled line group, the inductance matrix of the coupled line group, the impedance matrix of the coupled line group, normal model propagation velocities, any other pertinent or desirable parameters, or any combinations thereof), etc.

Figure 4:
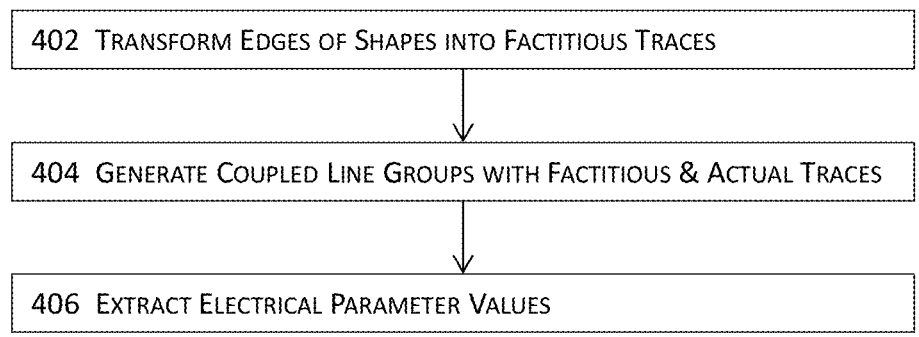
FIG. 4 illustrates a high level block diagram for implementing coplanar waveguide transmission lines in electronic designs in one or more embodiments.

FIG. 4 illustrates a high level block diagram for implementing coplanar waveguide transmission lines in electronic designs in one or more embodiments. Edges of electrically conductive shapes (e.g., metal shapes, polysilicon shapes, etc.) of an electronic design may be transformed into model traces at 402. The electronic design may include actual traces and electrically conductive shapes in one or more layers (e.g., a power layer, a ground layer, a signal layer, a patch layer, etc.) It shall be noted that the term traces may include wires, interconnects, or traces and shall not be limited to conventional traces unless otherwise specified.

An actual trace may be distinguished from a model trace which is transformed from an edge of an electrically conductive shape or a portion thereof. A model trace transformed from an edge of an electrically conductive shape has the same thickness as that of the electrically conductive shape or an actual trace on the same layer as the electrically conductive shape. In addition, a model trace may have the same length as the edge from which the model trace is transformed. The width of a model trace is the larger of the width of the electrically conductive shape from which the model trace is transformed or a maximum permissible trace width (e.g., 2-mm for a PCB trace) in some embodiments.

One or more coupled line groups may be generated at 404. A coupled line group may include one or more actual traces and one or more model traces in some embodiments. In some of these embodiments, a coupled line group includes a model trace as one or both outermost traces in a coupled line group. In these embodiments, the one or more actual traces are sandwiched between two electrically conductive shapes or between an electrically conductive shape and an actual trace as the outermost traces.

The traces or segments thereof in a coupled line group form one or more coplanar waveguide transmission lines. Grouping these model and actual traces into a coupled line group may be performed based in part or in whole upon one or more criteria. In some embodiments, the one or more criteria may include one or more physics based criteria such as the coupling coefficient, permissible electromagnetic interference or EMI at a frequency or a range of frequency, permissible intersymbol interference or ISI, rise time for a signal, permissible or desirable threshold for crosstalk, etc.

In some of these embodiments, a user may directly specify these one or more physics based criteria, rather than some geometry based criteria (e.g., a spacing between two immediately neighboring traces), and the processes and techniques described herein automatically analyzes an electronic design or a portion thereof to identify and group traces into one or more coupled line groups according to the one or more physics based criteria specified by the user. For example, traces or segments thereof may be grouped into a coupled line group if the coupling ratio or coupling coefficient exceeds a predetermined threshold such as 2%.

In addition or in the alternative, the one or more criteria may further include a criterion that traces in the same coupled line group share the same top and/or bottom reference planes (e.g., a ground plane, a power plane, etc.) It shall be noted that the capability that various mechanisms and techniques described herein allow user to specify physics based criteria for grouping and generation of coupled line groups does not prevent various tools or the users to account for geometry based criteria in generating coupled line groups. For example, the one or more criteria may include the spacing value between two immediately neighboring conductors because the spacing value may affect the coupling capacitance between two adjacent conductors and hence the rise time.

In these embodiments, the spacing between a coplanar waveguide transmission line (e.g., an actual trace) and an immediately neighboring model trace may also be an objective or a control parameter for optimization in devising the portion of the electronic design. Another example of a geometry based criterion for the one or more criteria for grouping traces into a coupled line group is the permissible deviation from parallelism between two edges (e.g., an edge of an electrically conductive shape or an actual trace). In some embodiments, signal lines (interconnects, wires, and/or traces) may be optionally excluded from the grouping and construction of coupled line groups and/or the subsequent electrical analyses.

With some of the techniques provided herein, if two electrical conductors meet the one or more physics-based criteria, these two electrical conductors may be grouped into a coupled line group which will be analyzed together as a group, rather than being analyzed individually. Grouping actual and model traces into one coupled line group and analyzing the coupled line group or all of the coupled line groups in an electronic design or a portion thereof as a whole is in sharp contrast with some conventional approaches which separately analyze the electromagnetic coupling between multiple actual traces and the electromagnetic coupling between a metal shape and its immediately neighboring trace in the multiple actual traces and provide much more accurate and realistic results.

Electrical parameters may be extracted at 406 from the analysis results. In some embodiments, electrical behavior (e.g., waveforms) of an electronic circuit or a portion thereof may be extracted from the analysis results without having to perform additional computation because of the explicit specification of one or more physics based criteria in constructing coupled line groups. For example, coupling coefficient or coupling ratio, permissible electromagnetic interference at a frequency or a range of frequency, permissible intersymbol interference, rise time for a signal, permissible or desirable threshold for crosstalk, or any combinations thereof may be extracted from the analysis results at 406.

Figure 5A:
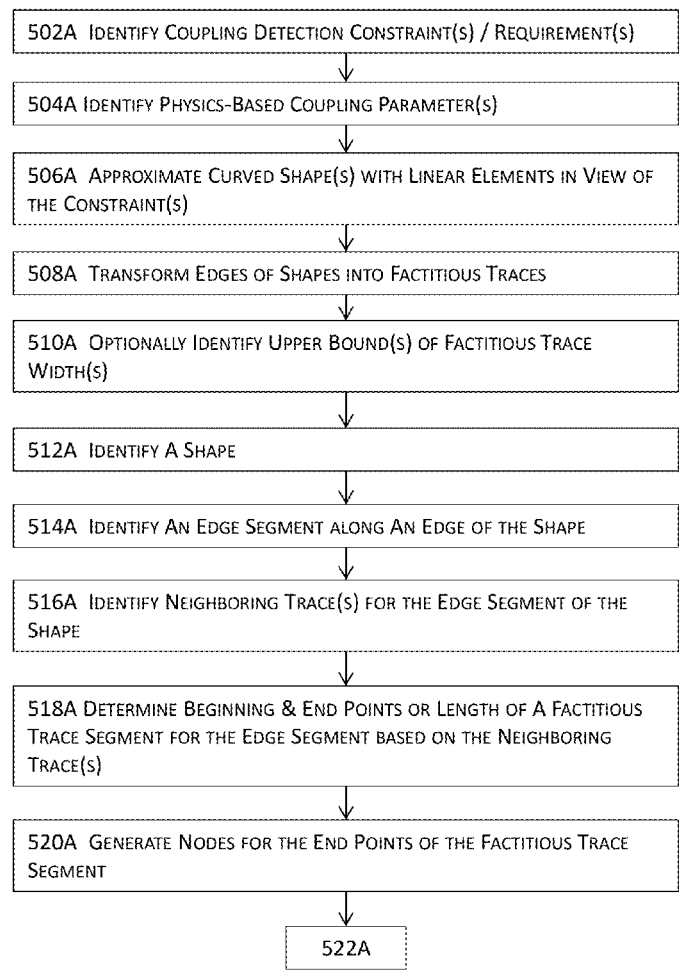
FIGS. 5A-B illustrates a more detailed block diagram for implementing coplanar waveguide transmission lines in electronic designs in one or more embodiments.
Figure 5B:
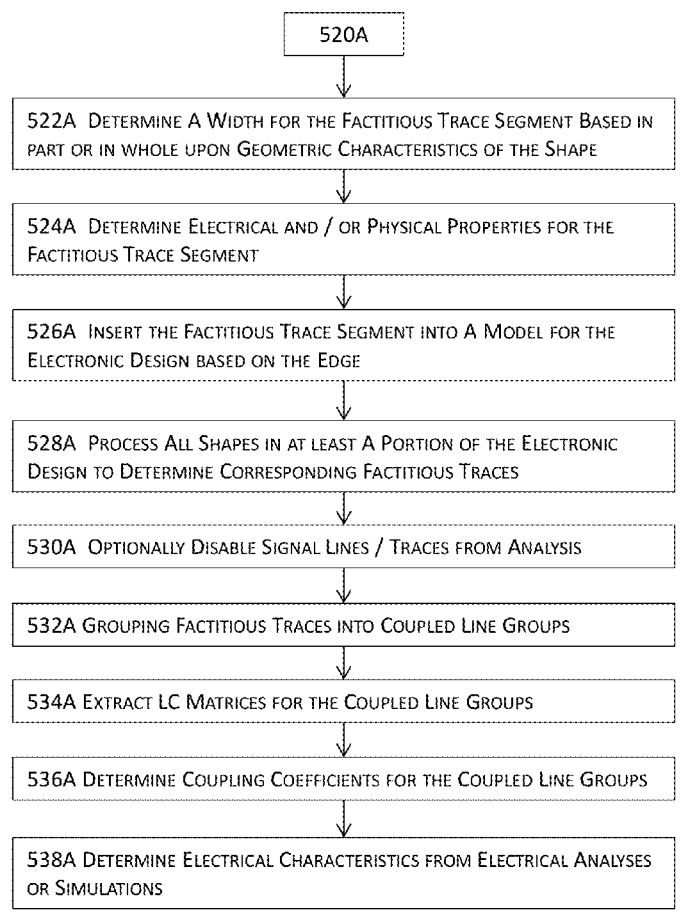

FIGS. 5A-B illustrates a more detailed block diagram for implementing coplanar waveguide transmission lines in electronic designs in one or more embodiments. In these one or more embodiments, one or more coupling detection constraints, requirements, or criteria (collectively criterion or criteria) may be identified at 502A. A coupling detection constraint or requirement may be used to determine whether or not the electromagnetic coupling between two traces (actual and/or model) is sufficiently significant so that these two traces may be grouped into the same coupled line group.

In some embodiments, the one or more coupling detection constraints or requirements may include, for example, traces eligible for grouping into the same coupled line group having the same top and/or bottom reference planes. The one or more coupling detection constraints or requirements may require the angle between two traces in a coupled line group be smaller than or equal to a certain value (e.g., 20 degrees). A coupling detection constraint or requirement may option- ally require that the spacing between two traces is less than a predetermined multiple of the width of the trace (e.g., the actual trace) in some embodiments.

For example, the coupling detection constraint or requirement may be expressed as: (spacing between a coplanar waveguide transmission line and a neighboring trace)≤n× (width of the coplanar waveguide transmission line and a neighboring trace), where n is a real number greater than one (1). In some embodiments, the spacing between two traces (actual and/or model) may be a control parameter or target for optimization so that the analysis mechanism may determine optimize the spacing value to meet a performance goal (e.g., electromagnetic interference or EMI, radio frequency interference or RFI, intersymbol interference or ISI, crosstalk, etc.) This coupling detection constraint or requirement is to determine whether or not the trace may be considered as a coplanar waveguide transmission line. Another coupling detection constraint or requirement may require a minimum ratio (e.g., length:width≥1.5:1) of the length of a trace to the width of the trace.

One or more coupling parameters may be identified at 504A. For example, a user may provide or specify a coupling parameter. In some embodiments, the one or more coupling parameters may include one or more physics based parameters. For example, the one or more coupling parameters may include a coupling coefficient between two traces, and the coupling coefficient may be required to be over a certain value for the two traces to be eligible for grouping into the same coupled line group. As another example, the one or more coupling parameters may include the rise time of a net, and this coupling parameter may also be required to have some certain value which further constrains the length of the net to be of at least a certain value. For example, the one or more coupling parameters may include parameter values for physics based coupling parameters including electromagnetic interference (EMI) at a frequency or a range of frequency, intersymbol interference (ISI), rise time for a signal, threshold for crosstalk, etc. These parameter values may be used to determine whether certain traces may be grouped into the same coupled line group, or whether a trace is considered a coplanar waveguide transmission line.

In some embodiments where an electrically conductive shape may include one or more curved boundaries, these one or more curved boundaries may be approximated by linear boundary segments at 506A based in part or in whole upon the one or more coupling detecting detection constraints or requirements. As the example in FIGS. 2C-E illustrate, the curved boundary 206C is approximated with linear boundary segments 202D, 204D, 206D, 208D, and 210D. In some other embodiments, an electrically conductive shape having irregular shapes other than quadrilateral shapes may be approximated with a quadrilateral shape having a constant width. The constant width may be determined with different methods.

For example, a constant width may be determined by averaging different widths of different portions of an electrically conductive shape. In the example shown in FIG. 2B, the electrically conductive shape 202B may be approximated with a rectangular shape having a constant width. The electrically conductive shape 202B comprises four rectangular segments 206B having a width "w1" and a length "l1", 208B having a width "w2" and a length "l2", 210B having a width "w3" and a length "l3", and 212B having a width "w4" and a length "l4". In some of these embodiments, the constant width may be determined to be the average of the four width values or (w1+w2+w3+w4)/4.

In some other embodiments, the constant width may be determined as a weighted average of the four width values. For example, the constant width may be determined to be (w1×l1+w2×l2+w3×l3+w4×l4)/(l1+l2+l3+l4). In these embodiments, the determined constant width will produce the same surface area for the quadrilateral as the original shape 202B. In some other embodiments, an electrically conductive shape may be decomposed into multiple portions, each having a constant width, and the edges of each portion will be analyzed or processed individually to form model traces as described above with reference to FIG. 4.

One or more edges of an electrically conductive shape may be transformed at 508A into one or more corresponding model traces in an identical or substantially similar manner as that described above for reference numeral 402 of FIG. 4. An upper bound for model trace widths may be optionally identified at 510A. The upper bound may be determined based in part or in whole upon, for example, the skin effect or the skin depth of an alternating electric current (AC) distributed within an electrical conductor. The upper bound may also vary with the operating frequencies of electronic designs of interest and may decrease as the operating frequency increases in some embodiments. In some embodiments, the upper bound comprises a value of 2-mm.

In some embodiments, at least the edges along the length direction of all electrically conductive shapes will be processed and transformed into model traces. In these embodiments, the process needs not determine which edges are to be transformed, and which other edges are not to be transformed and may thus conserve more computation resources. In some of these embodiments, the edges of actual traces will not be transformed into model traces. In some other embodiments, not all of the edges along the length direction of electrically conductive shapes will be transformed into model traces.

For example, electrically conductive shapes in portions of an electronic design where interferences (e.g., cross-talk, EMI, RFI, ISI, etc.) are not of a primary concern, the electrically conductive shapes in these portions may not be transformed into model traces. In the model for analyzing the electronic design with the model and actual traces, a model trace may inherit the electrical properties of the electrical conductive shape from which the model trace is derived. In some embodiments, one or more edges not along the length direction of an electrically conductive shape may also be transformed into one or more corresponding model traces at 508A.

A shape may be identified at 512A; and an edge segment along an edge of the shape may be identified at 514A. In some embodiments, an entire edge may be identified at 514A. One or more neighboring traces for the edge segment may be identified at 516A. The edge of the identified shape has been transformed into a model trace (at 508A). The beginning node and end node or the length of the model trace segment for the edge segment may be identified at 518A based in part or in whole upon the one or more neighboring traces identified at 516A, the one or more coupling detection constraints or requirements identified at 502A, and/or the one or more physics-based coupling parameters identified at 504A.

For example, the beginning node and/or the end node may be determined by orthogonally projecting the one or more neighboring traces or their end points onto the edge of the shape. Optionally, a node may be generated and placed at 520A for each of the beginning node and end node of the model trace segment. One or more geometric characteristics of the model trace segment may be determined at 522A based in part or in whole upon one or more geometric characteristics of the shape identified at 512A. For example, the model trace width may be the smaller of the width of the shape identified at 512A or the upper bound optionally identified 510A. In addition, the thickness of the model trace may be set to the thickness of the shape identified at 512A.

The length of the model trace segment may be determined based in part or in whole upon the one or more neighboring traces. For example, the length of the model trace segment for the edge segment may be determined by orthogonally projecting the one or more neighboring traces or their end points onto the edge of the shape in some embodiments. At 524A, one or more electrical properties and/or one or more physical properties may be determined for the model trace segment. In some embodiments, a model trace or a segment thereof inherits the one or more electrical properties and/or one or more physical properties from the shape identified at 512A, instead of some artificially assigned property values.

In some embodiments, all electrically conductive shapes in an electronic design or a portion thereof may be similarly processed at 528A to transform at least the edges along the length direction of these electrically conductive shapes into model traces. In some of these embodiments, one or more edges or segments thereof not along the length direction of an electrically conductive shape may also be transformed into one or more corresponding factious traces. In some other embodiments, not all of the edges along the length direction of electrically conductive shapes will be transformed into model traces. For example, electrically conductive shapes in portions of an electronic design where interferences (e.g., cross-talk, EMI, RFI, etc.) are not of a primary concern, the electrically conductive shapes in these portions may not be transformed into model traces.

The signal lines (e.g., interconnects, wires, or traces) may be optionally disabled or ignored at 530A in the model including the actual and model traces or in subsequent electrical analyses or simulations in some embodiments. The model traces may be grouped into one or more coupled line groups at 532A. In some embodiments, a model trace is not to be sandwiched between two actual traces in a coupled line group. In these embodiments, a model trace may only be an outermost trace in the coupled line group.

One or more actual traces may, however, be sandwiched between model traces, actual traces, or a combination of a model trace and an actual trace. In some embodiments, traces (actual and/or model) may have the same width in a coupled line group although traces in the same coupled line group may have different widths in some other embodiments. In addition or in the alternative, a coupled line group having multiple traces may be formed based in part or in whole upon electrical analysis results in some embodiments.

In these embodiments, whether or not a trace (e.g., actual trace or model trace) may be grouped into a coupled line group with one or more other traces may be determined based in part or in whole upon one or more criteria. The one or more criteria may include, for example, the coupling coefficient characterizing the electromagnetic interaction between a trace and one or more other traces in a coupled line group, the rise time describing a signal (e.g., the voltage value) along the trace or along one or more other traces in a coupled line group, interferences between the trace and one or more other traces in the coupled line group, or any combinations thereof.

For example, a trace may be grouped into a coupled line group in some embodiments if the coupling coefficient between the trace and one or more other traces exceeds a certain predetermined value for coupling coefficients to indicate a significant interaction between the trace and the one or more other traces. As another example, a trace may be grouped into a coupled line group in some embodiments if the rise time of signals (e.g., the time taken by a signal to change from a specified low value to a specified high value) carried by the trace or by one or more other traces in a coupled line group exceeds a predetermined value.

At 534A, RLC (resistance(R), inductance (L), capacitance (C)) matrices may be extracted, and coupling coefficients may be determined at 536A for the coupled line groups. In some embodiments, one or more coupled line groups may be ignored or discarded if the coupling coefficient(s), the rise time(s), and/or interferences (e.g., EMI, RFI, ISI, etc.) are below their respective prescribed values. In some other embodiments, one or more physics based criteria will be first evaluated for a plurality of traces before grouping the plurality of traces into a coupled line group. For example, the coupling coefficient(s), the rise time(s), and/or the interferences, etc. may be first evaluated to determine whether or not the plurality of traces may be grouped into a coupled line group.

At 538A, one or more electrical analyses or simulations may be performed with at least some of the coupled line groups. For example, one or more RF (radio frequency) characteristics of a coplanar waveguide meander line may be evaluated by an electromagnetic field solver or simulator. The performance of the electronic design (e.g., a matching integrated circuit design with an integrated amplifier design such as a wireless chip design) may be predicted based at least in part upon the RF characteristics. The electronic design may be devised or revised based in part or in whole upon the analysis results indicating whether or not the performance objectives have been achieved.

Figure 5C:
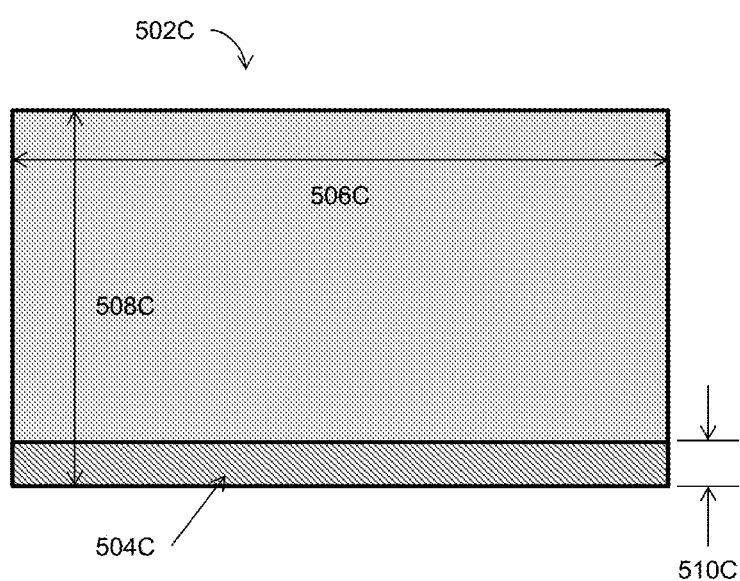
FIG. 5C illustrates a simplified metal shape and a model trace associated with the simplified metal shape in one or more embodiments.

FIG. 5C illustrates a simplified metal shape and a model trace associated with the simplified metal shape in one or more embodiments. More specifically, FIG. 5C illustrates an electrically conductive shape 502C having a length 506C and a width 508C. In this example, the bottom edge of the electrically conductive shape 502C is transformed into a model trace 504C. In this example, the length of the model trace 504C may be determined to be smaller than or equal to the length 506C of the electrically conductive shape 502C. In some embodiments, the length of a model trace may be determined based in part or in whole upon one or more neighboring traces. The thickness of the model trace 504C is equal to the thickness of the electrically conductive shape 502C. The width of the model trace 504C may be determined to be the smaller of the width 508C of the electrically conductive shape 502C or the upper bound for model traces in some embodiments.

Figure 5D:
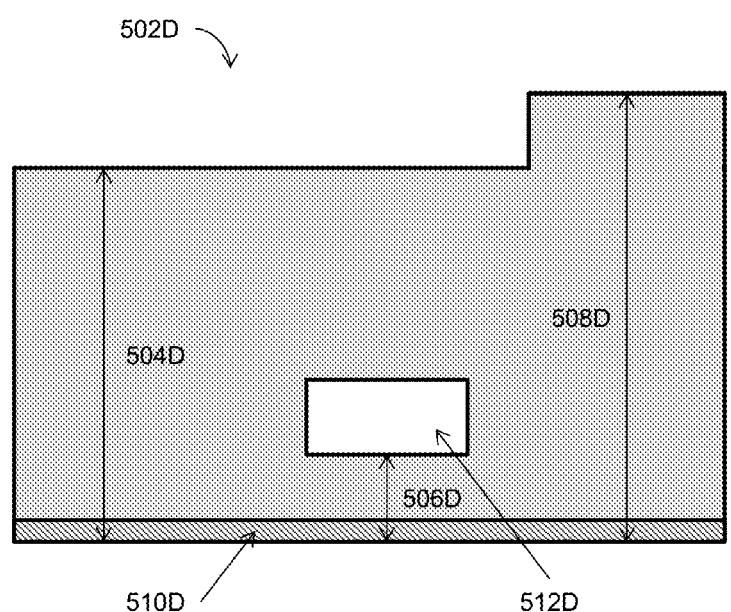
FIG. 5D illustrates another simplified metal shape and a model trace associated with the simplified metal shape in one or more embodiments.

FIG. 5D illustrates another simplified metal shape and a model trace associated with the simplified metal shape in one or more embodiments. In this example, an electrically conductive shape 502D includes an aperture 512D. The electrically conductive shape 502D has a single length value but three different width values 504D, 506D, and 508D as shown in FIG. 5D. The bottom edge of the electrically conductive shape 502D is transformed into a model trace 510D. In some embodiments, the length of the model trace 510D may be determined to be smaller than or equal to the length of the electrically conductive shape 502D. The thickness of the model trace 510D may also be determined to be the thickness of the electrically conductive shape 502D. The width of the model trace 510D may be determined to be an average of the three different width values—(504D+506D+508D)/3—in some embodiments.

Figure 5E:
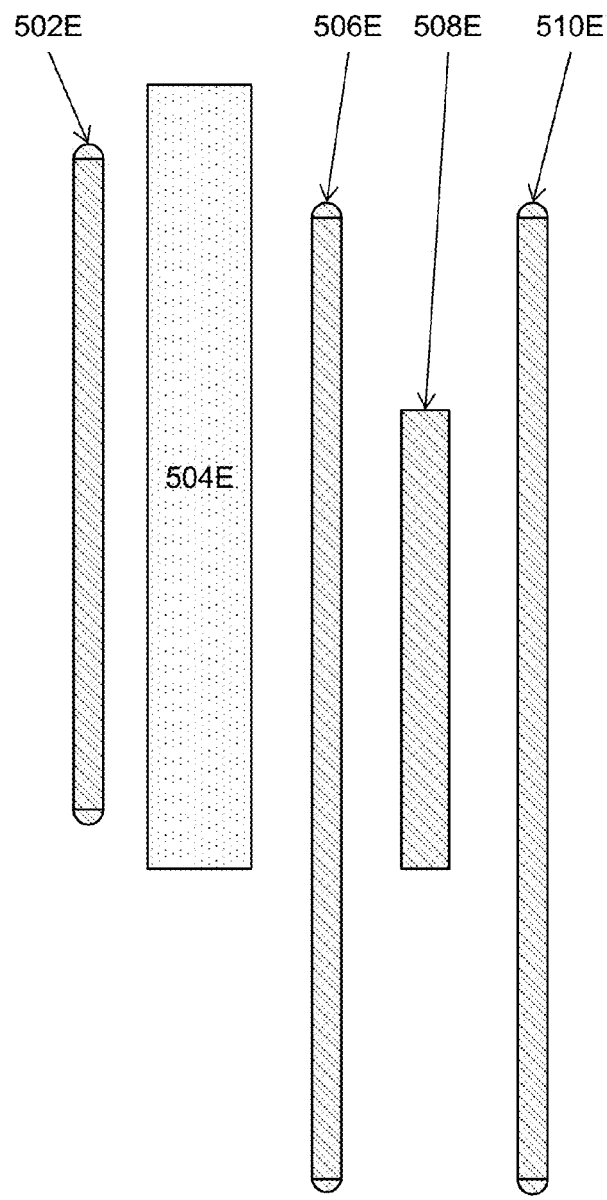
FIG. 5E illustrates a portion of a simplified electronic design including a plurality of metal shapes and actual traces in one or more embodiments.

FIG. 5E illustrates a portion of a simplified electronic design including a plurality of metal shapes and actual traces in one or more embodiments. In this example, the portion of the simplified electronic design includes three actual traces—502E, 506E, and 510E—as well as two electrically conductive shapes—504E and 508E—as arranged in FIG. 5E.

Figure 5F:
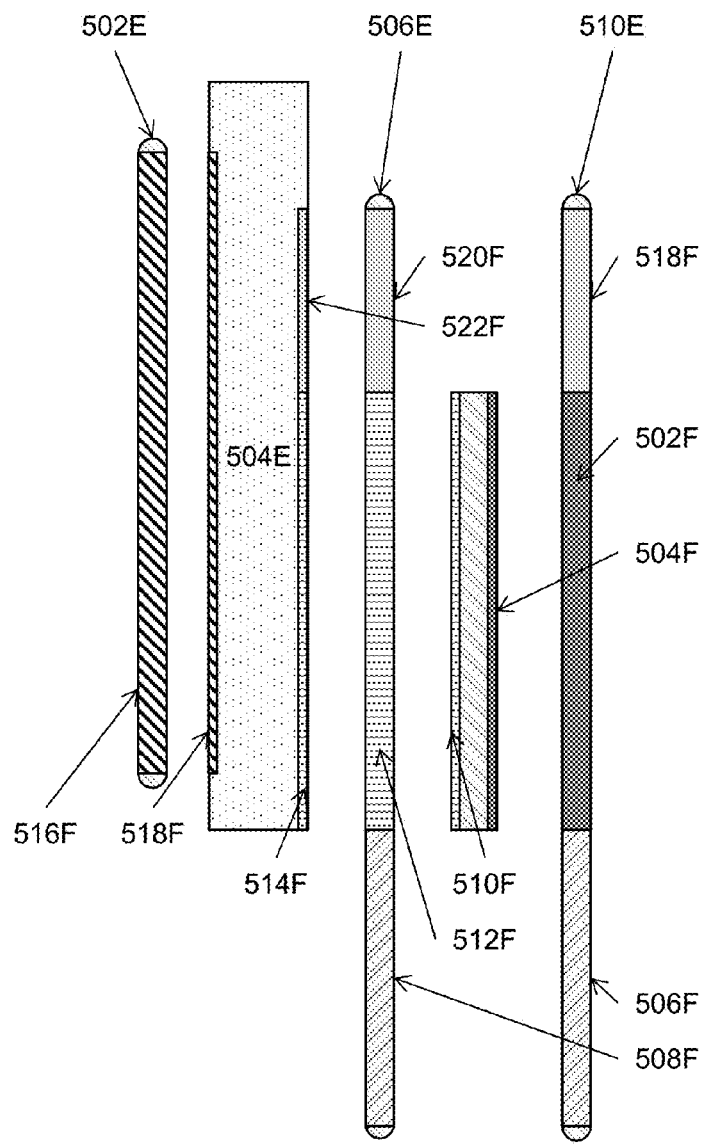
FIG. 5F illustrates an example of coupled line groups for the portion of the simplified electronic design illustrated in FIG. 5E in one or more embodiments.

FIG. 5F illustrates an example of coupled line groups for the portion of the simplified electronic design illustrated in FIG. 5E in one or more embodiments. By using the techniques described above with reference to FIG. 4 or FIGS. 5A-B, the edge segments of the electrically conductive shapes 504E may be transformed into model trace 518F and 514F; and the edge segments of the electrically conductive shapes 504E may be transformed into model trace 504F and 510F. In this example, the portion of the simplified electronic design illustrated in FIG. 5E includes the first coupled line group comprising the actual trace segment 502F and the model trace segment 504F having the same length, the second coupled line group comprising the actual trace segment 518F, actual trace segment 520F, and the model trace segment 522F having the same length, and the third coupled line group comprising the actual trace segment 506F and the actual trace segment 508F having the same length.

The portion of the simplified electronic design further includes the fourth coupled line group comprising the model trace segment 510F, the actual trace segment 510F, and the model trace segment 514F having the same length and the fifth coupled line group comprising the model trace segment 518F and the actual trace segment 516F having the same length. In some embodiments, one or more coupled line groups may be graphically and/or textually emphasized with corresponding unique identifications.

Figure 5G:
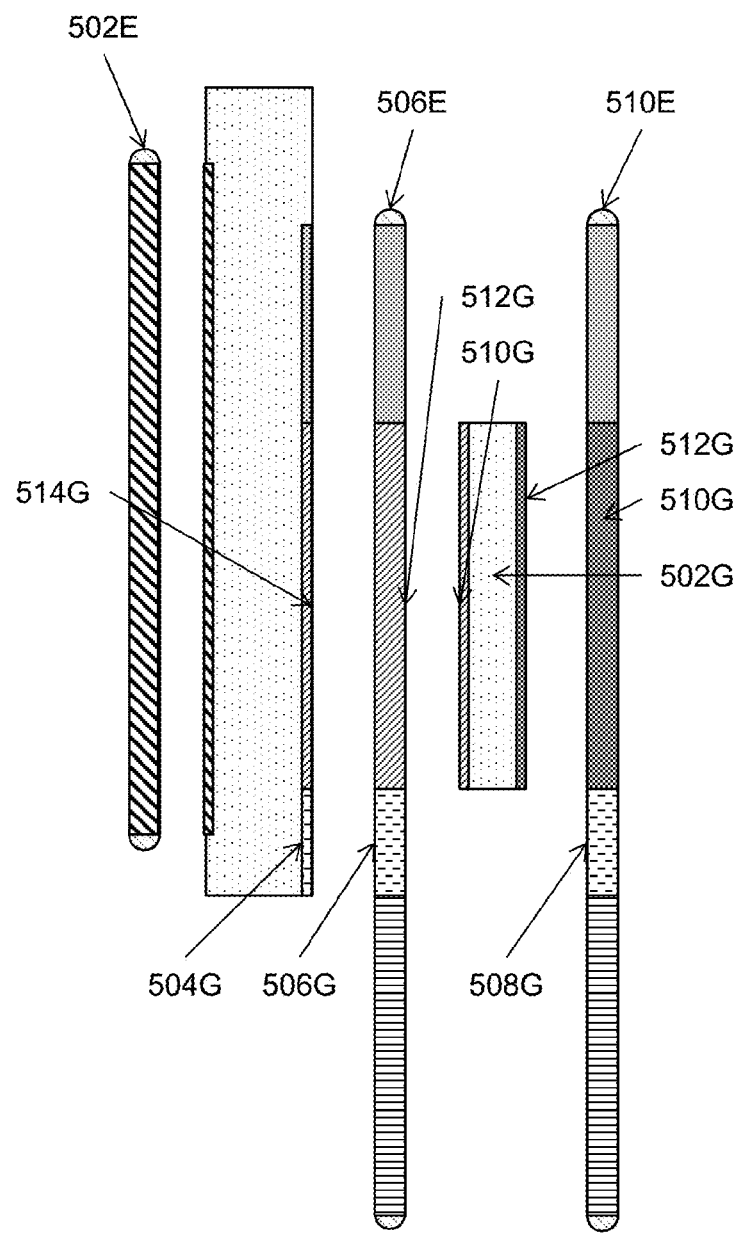
FIG. 5G illustrates another example of coupled line groups for another portion of a simplified electronic design in one or more embodiments.

FIG. 5G illustrates another example of coupled line groups for another portion of a simplified electronic design in one or more embodiments. The difference between FIG. 5F and FIG. 5G is that the electrically conductive shape 502G is shorter than the electrically conductive shape 508E. As a result of this difference, the actual trace segment 510G and the model trace segment 512G become shorter with a length identical to that of the electrically conductive shape 502G. Similarly, the model trace segment 510G, the actual trace segment 512G, and the model trace segment 514G also have a shorter length identical to that of the electrically conductive shape 502G. In addition, another coupled line group is formed to include the model trace segment 504G and the actual trace segments 506G and 508G.

Figure 5H:
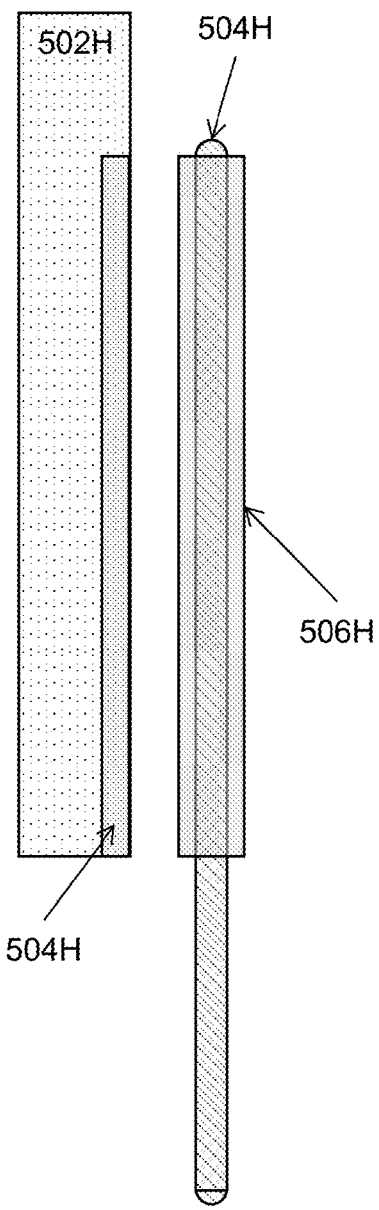
FIG. 5H illustrates an example of representing model traces in a portion of a simplified electronic design in one or more embodiments.

The other two coupled line groups—the third coupled line group comprising the actual trace segment 506F and the actual trace segment 508F and the fifth coupled line group comprising the model trace segment 518F and the actual trace segment 516F—remain the same as shown in FIG. 5F. FIG. 5H illustrates an example of representing model traces in a portion of a simplified electronic design in one or more embodiments. In this example, the traces in a coupled line group may be graphically emphasized with rectangular markers having exactly or approximately identical or slightly larger dimensions as the respective actual and/or model trace segments.

System Architecture Overview

FIG. 6 illustrates a block diagram of an illustrative computing system 600 suitable for implementing coplanar waveguide transmission lines in electronic designs as described in the preceding paragraphs with reference to various figures. Computer system 600 includes a bus 606 or other communication mechanism for communicating information, which interconnects subsystems and devices, such as processor 607, system memory 608 (e.g., RAM), static storage device 609 (e.g., ROM), disk drive 610 (e.g., magnetic or optical), communication interface 614 (e.g., modem or Ethernet card), display 611 (e.g., CRT or LCD), input device 612 (e.g., keyboard), and cursor control (not shown).

According to one embodiment, computing system 600 performs specific operations by one or more processor or processor cores 607 executing one or more sequences of one or more instructions contained in system memory 608. Such instructions may be read into system memory 608 from another computer readable/usable storage medium, such as static storage device 609 or disk drive 610. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 607, where the one or more processors, one or more processor cores, or combination thereof executes one or more threads. For example, various identifications, determinations, groupings, processing, markings, detection, analyses, or simulations, etc. may be performed by one or more mechanisms (e.g., one or more mechanisms described in FIG. 1A) including or functioning in tandem with one or more processors, one or more processor cores, or combination thereof.

A mechanisms described herein may also be implemented as a pure hardware module (e.g., a block of electronic circuit components, electrical circuitry, etc.) or a combination of a hardware module and a software block that jointly perform various tasks to achieve various functions or purposes described herein or equivalents thereof. For example, a mechanism described herein may be implemented as an application-specific integrated circuit (ASIC) in some embodiments.

In these embodiments, a mechanism may thus include, for example, a microprocessor or a processor core and other supportive electrical circuitry to perform specific functions which may be coded as software or hard coded as a part of an application-specific integrated circuit, ROM (read only memory), PROM (programmable read only memory), EPROM (erasable programmable read only memory), etc. despite the fact that these microprocessor, processor core, and electrical circuitry may nevertheless be shared among a plurality of mechanism. A mechanism described herein or an equivalent thereof may perform its respective functions alone or in conjunction with one or more other mechanisms. A mechanism described herein or an equivalent thereof may thus invoke one or more other mechanisms by, for example, issuing one or more commands or function calls. The invocation of one or more other mechanisms may be fully automated or may involve one or more user inputs.

The term "computer readable storage medium" or "computer usable storage medium" as used herein refers to any non-transitory medium that participates in providing instructions to processor 607 for execution. Such a medium may take many forms, including but not limited to, non-volatile media and volatile media. Non-volatile media includes, for example, optical or magnetic disks, such as disk drive 610. Volatile media includes dynamic memory, such as system memory 608. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 600. According to other embodiments of the invention, two or more computer systems 600 coupled by communication link 615 (e.g., LAN, PTSN, or wireless network) may perform the sequence of instructions required to practice the invention in coordination with one another.

Computer system 600 may transmit and receive messages, data, and instructions, including program, i.e., application code, through communication link 615 and communication interface 614. Received program code may be executed by processor 607 as it is received, and/or stored in disk drive 610, or other non-volatile storage for later execution. In an embodiment, the computing system 600 operates in conjunction with a data storage system 631, e.g., a data storage system 631 that includes a database 632 that is readily accessible by the computing system 600. The computing system 600 communicates with the data storage system 631 through a data interface 633. A data interface 633, which is coupled with the bus 606, transmits and receives electrical, electromagnetic or optical signals that include data streams representing various types of signal information, e.g., instructions, messages and data. In embodiments of the invention, the functions of the data interface 633 may be performed by the communication interface 614.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for implementing coplanar waveguide transmission lines in an electronic design, comprising:

transforming a plurality of edge segments of one or more electrically conductive shapes in at least a portion of an electronic design into a plurality of model trace segments;

generating one or more coupled line groups with the plurality of model trace segments and one or more actual trace segments into a model for the electronic design based at least in part upon a threshold limit on undesirable coupling effects, wherein an actual trace segment includes an electrically conductive part of the electronic design, and a model trace segment is not a part of the electronic design for manufacturing; and devising or revising, with an electronic design implementation mechanism including or functioning in conjunction with at least one micro-processor of a computing system, the at least the portion of the electronic design based in part or in whole upon extracted electrical parameter values from electrical analysis results of the model.

2. The computer implemented method of claim 1, further comprising:
identifying one or more coupling detection constraints or requirements; and
identifying one or more coupling parameters.

3. The computer implemented method of claim 1, further comprising:
identifying an electrically conductive shape from the one or more electrically conductive shapes; and
identifying one or more neighboring traces of the electrically conductive shape.

4. The computer implemented method of claim 3, further comprising at least one of:
determining one or more electrical properties for a model trace segment of the plurality of trace segments; or
approximating a curved boundary segment of the electrically conductive shape with a plurality of linear boundary segments.

5. The computer implemented method of claim 3, further comprising:
identifying an edge segment of the electrically conductive shape based in part or in whole upon the one or more neighboring traces; and
determining a size or a location for a model trace segment in the plurality of model trace segments for the edge segment.

6. The computer implemented method of claim 5, wherein determining the size or the location for the model trace segment comprises:
identifying end points of the model trace segment based in part or in whole upon at least one neighboring trace of the one or more neighboring traces.

7. The computer implemented method of claim 5, wherein determining the size or the location for the model trace segment comprises:
identifying an edge width of the edge segment;
identifying an upper bound for model trace widths; and
determining a width for the model trace segment based in part or in whole upon the edge width and/or the upper bound.

8. The computer implemented method of claim 1, further comprising:
grouping at least one model trace segment of the plurality of model trace segments and at least one actual trace segment of the one or more actual trace segments into a coupled line group of the one or more coupled line groups based in part or in whole upon one or more criteria.

9. The computer implemented method of claim 8, wherein the at least one model trace segment is immediately neighboring to at most one actual trace segment.

10. The computer implemented method of claim 1, further comprising:
determining one or more coupling characteristics for a coupled line group of the one or more coupled line groups;
performing one or more electrical analyses or simulations on the one or more coupled line groups in the model to generate the electrical analysis results; and
extracting the extracted electrical parameter values from the electrical analysis results.

11. The computer implemented method of claim 1, wherein a coupled line group is generated based in part or in whole upon one or more criteria, and the one or more criteria comprise at least one physics based criterion without geometry based criteria.

12. The computer implemented method of claim 1, further comprising:
discarding a first coupled line group from the one or more coupled line groups based in part or in whole upon one or more coupling characteristics of the first coupled line group; and
analyzing or simulating the model for electrical behavior of the at least the portion of the electronic design without accounting for the first coupled line group.

13. A system for implementing coplanar waveguide transmission lines in an electronic design, comprising:
one or more mechanisms, at least one of which comprises at least one microprocessor including one or more processor cores executing one or more threads in a computing system;
a non-transitory computer accessible storage medium storing thereupon program code that includes a sequence of instructions that, when executed by the at least one micro-processor or processor core of a computing system, causes the at least one micro-processor or processor core at least to:
transform a plurality of edge segments of one or more electrically conductive shapes in at least a portion of an electronic design into a plurality of model trace segments;
generate one or more coupled line groups with the plurality of model trace segments and one or more actual trace segments into a model for the electronic design based at least in part upon a threshold limit on undesirable coupling effects, wherein
an actual trace segment includes an electrically conductive part of the electronic design, and a model trace segment is not a part of the electronic design for manufacturing; and
devise or revise the at least the portion of the electronic design based in part or in whole upon extracted electrical parameter values from electrical analysis results of the model.

14. The system of claim 13, wherein the program code includes further instructions that, when executed by the at least one micro-processor or processor core, cause the at least one processor or processor core to:
determine one or more coupling characteristics for a coupled line group of the one or more coupled line groups;
perform one or more electrical analyses or simulations on the one or more coupled line groups in the model to generate the electrical analysis results; and
extract the extracted electrical parameter values from the electrical analysis results.

15. The system of claim 13, wherein the program code includes further instructions that, when executed by the at least one micro-processor or processor core, cause the at least one processor or processor core to:
grouping at least one model trace segment of the plurality of model trace segments and at least one actual trace segment of the one or more actual trace segments into a coupled line group of the one or more coupled line groups based in part or in whole upon one or more criteria, wherein the at least one model trace segment is immediately neighboring to at most one actual trace segment.

16. The system of claim 13, wherein the program code includes further instructions that, when executed by the at least one micro-processor or processor core, cause the at least one processor or processor core to:
   identify an electrically conductive shape from the one or more electrically conductive shapes; and
   identify one or more neighboring traces of the electrically conductive shape.

17. An article of manufacture comprising a non-transitory computer accessible storage medium having stored thereupon a sequence of instructions which, when executed by at least one processor or at least one processor core executing one or more threads, causes the at least one processor or the at least one processor core to perform a set of acts for implementing coplanar waveguide transmission lines in an electronic design, the set of acts comprising:
   transforming a plurality of edge segments of one or more electrically conductive shapes in at least a portion of an electronic design into a plurality of model trace segments;
   generating one or more coupled line groups with the plurality of model trace segments and one or more actual trace segments into a model for the electronic design based at least in part upon a threshold limit on undesirable coupling effects, wherein
      an actual trace segment includes an electrically conductive part of the electronic design, and a model trace segment is not a part of the electronic design for manufacturing; and
   devising the at least the portion of the electronic design based in part or in whole upon extracted electrical parameter values from electrical analysis results of the model.

18. The article of manufacture of claim 17, the set of acts further comprising:
   identifying one or more coupling detection constraints or requirements; and
   identifying one or more coupling parameters.

19. The article of manufacture of claim 17, the set of acts further comprising:
   identifying an electrically conductive shape from the one or more electrically conductive shapes; and
   identifying one or more neighboring traces of the electrically conductive shape.

20. The article of manufacture of claim 19, the set of acts further comprising:
   identifying an edge segment of the electrically conductive shape based in part or in whole upon the one or more neighboring traces; and
   determining a size or a location for a model trace segment in the plurality of model trace segments for the edge segment.

21. The article of manufacture of claim 20, the set of acts further comprising:
   identifying an edge width of the edge segment;
   identifying an upper bound for model trace widths; and
   determining a width for the model trace segment based in part or in whole upon the edge width and/or the upper bound.

* * * * *